United States Patent
Yang

(10) Patent No.: US 8,362,526 B2
(45) Date of Patent: Jan. 29, 2013

(54) LIQUID CRYSTAL DISPLAY DEVICE AND FABRICATING METHOD THEREOF

(75) Inventor: Joon Young Yang, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 1099 days.

(21) Appl. No.: 12/289,949

(22) Filed: Nov. 7, 2008

(65) Prior Publication Data

US 2009/0152562 A1  Jun. 18, 2009

Related U.S. Application Data

(62) Division of application No. 11/288,263, filed on Nov. 29, 2005, now Pat. No. 7,462,503.

(30) Foreign Application Priority Data

Dec. 8, 2004  (KR) .............................. 2004-0103178

(51) Int. Cl.
*H01L 29/76* (2006.01)

(52) U.S. Cl. ......... 257/213; 257/E21.619; 257/E33.001; 438/34; 438/149; 438/152; 438/153

(58) Field of Classification Search ................. 257/213, 257/E21.619, E33.001; 438/34, 149, 152, 438/153
See application file for complete search history.

(56) References Cited

U.S. PATENT DOCUMENTS

| | | | |
|---|---|---|---|
| 6,403,409 B1 | 6/2002 | You | |
| 6,617,203 B2 | 9/2003 | Kim et al. | |
| 6,753,235 B2 | 6/2004 | So et al. | |
| 7,300,831 B2 * | 11/2007 | Oh et al. | ........................ 438/151 |
| 7,643,101 B2 * | 1/2010 | Oh et al. | ........................ 349/43 |
| 2001/0003657 A1* | 6/2001 | Lee | ............................... 438/144 |
| 2001/0031519 A1* | 10/2001 | Ayres et al. | .................... 438/149 |
| 2002/0105033 A1* | 8/2002 | Zhang | ........................... 257/353 |
| 2004/0135216 A1* | 7/2004 | Suzawa et al. | ................ 257/408 |
| 2006/0234429 A1* | 10/2006 | Oh | ................................. 438/149 |

FOREIGN PATENT DOCUMENTS

| | | |
|---|---|---|
| JP | 07-056189 | 3/1995 |
| KR | 10-2003-0033132 | 5/2003 |

* cited by examiner

*Primary Examiner* — Jarrett Stark
*Assistant Examiner* — John M Parker
(74) *Attorney, Agent, or Firm* — Morgan, Lewis & Bockius LLP

(57) ABSTRACT

A method of fabricating a liquid crystal display device includes forming first, second, and third active patterns on a substrate having a pixel region and a driving region, wherein the first and second active patterns are in the driving region and the third active pattern is in the pixel region, the first, second, and third active patterns each having an active region, a source region, and a drain region with the source and drain regions on opposing sides of the active region, forming a gate insulator on the first, second, and third active patterns, forming first, second, and third gate electrodes on the gate insulator, wherein the first, second, and third gate electrodes correspond to the active regions of the first, second, and third active patterns, respectively, doping the source and drain regions of the first, second, and third active patterns with n− ions using the first, second, and third gate electrodes as a doping mask, doping the n− doped source and drain regions of the second active pattern with p+ ions, forming an interlayer insulating film on the first, second, and third gate electrodes and patterning the interlayer insulating film to form contact holes exposing each source and drain regions of the first, second, and third active patterns, and doping the source and drain regions of the first, second, and third active patterns with n+ ions through the contact holes.

9 Claims, 23 Drawing Sheets n+ n+

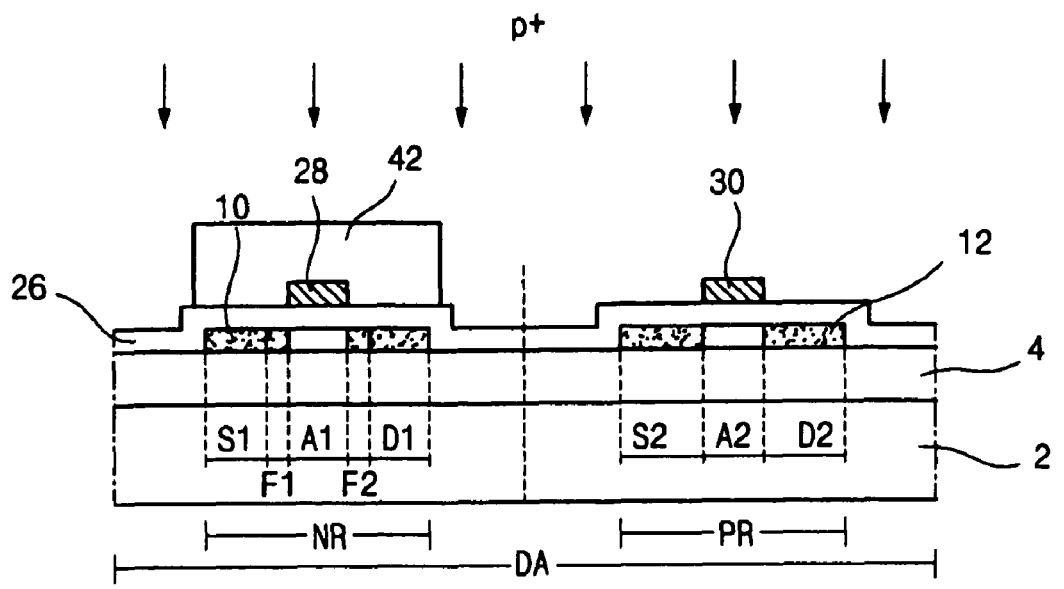
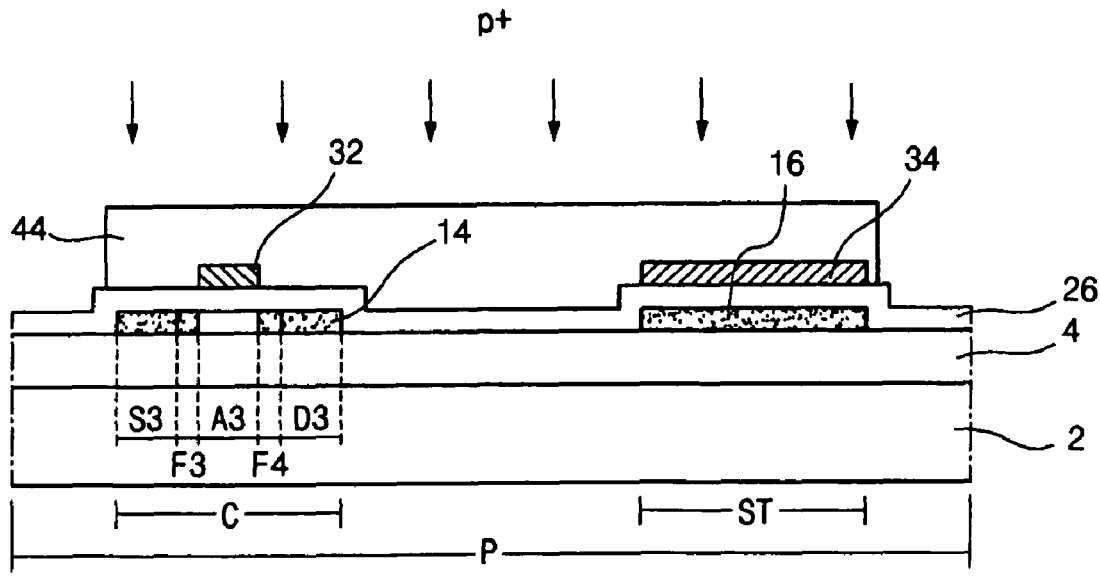

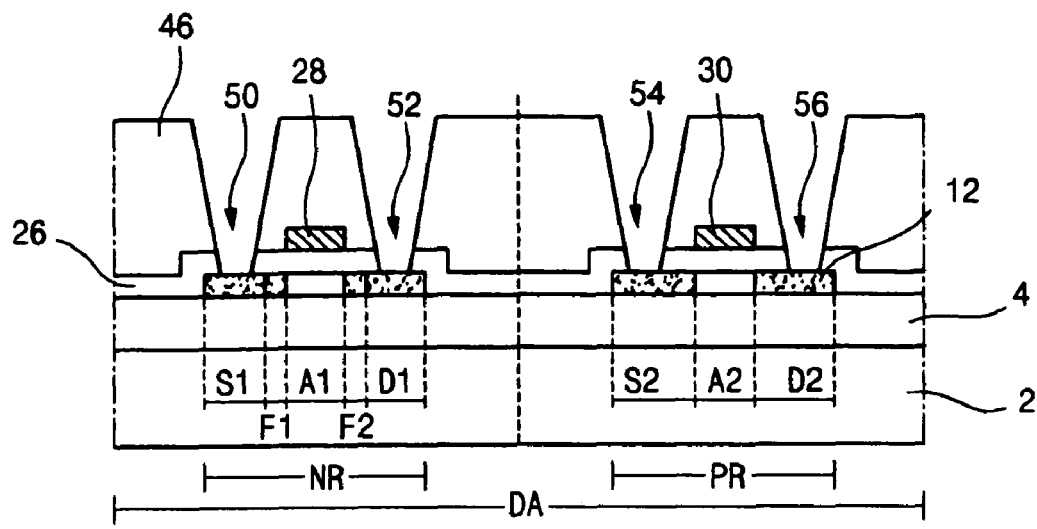
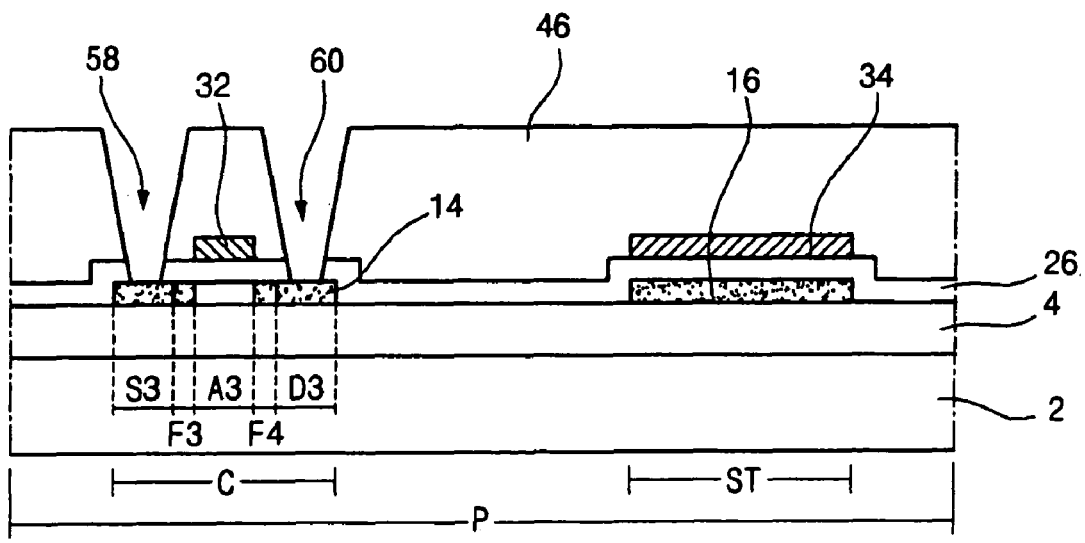

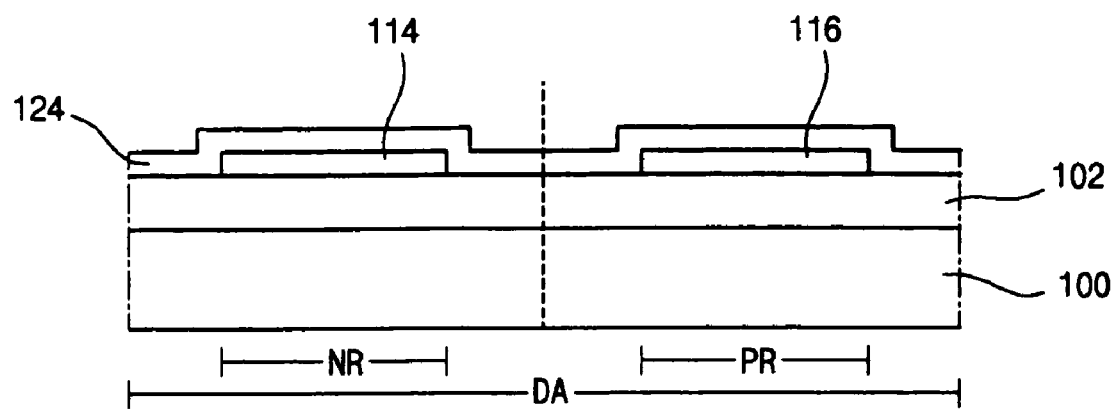
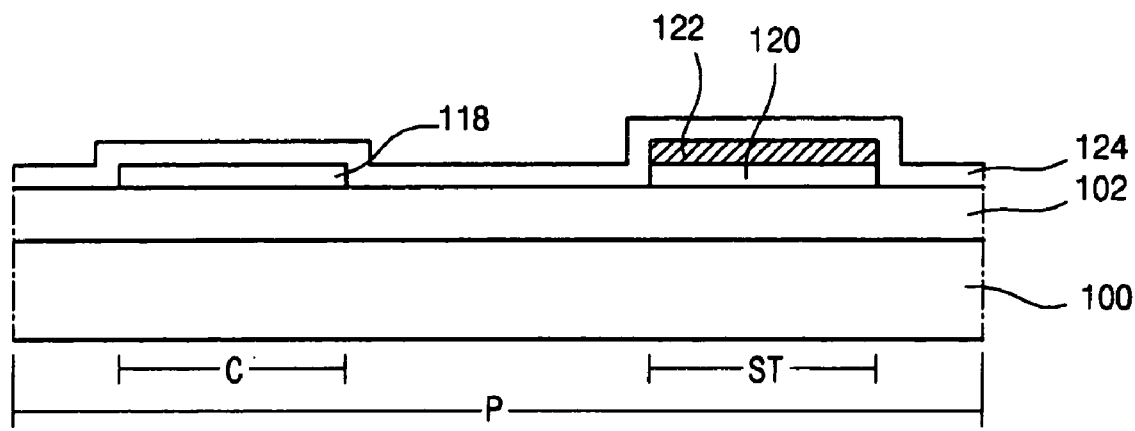

LIQUID CRYSTAL DISPLAY DEVICE AND FABRICATING METHOD THEREOF

This is a divisional application of application Ser. No. 11/288,263, filed on Nov. 29, 2005, now U.S. Pat. No 7,462,503 which is hereby incorporated by reference. This application claims the benefit of the Korean Patent Application No. 2004-0103178 filed on Dec. 8, 2004, which is hereby incorporated by reference.

BACKGROUND OF THE INVENTION

1. Field of the Invention

The present invention relates to a liquid crystal display device, and more particularly, to a liquid crystal display (LCD) device and a method of fabricating the LCD device.

2. Discussion of the Related Art

Flat panel display devices have begun to replace cathode-ray tubes (CRTs) for information display applications. Various types of flat panel displays, such as liquid crystal display (LCD) devices, plasma display panels (PDPs), field emission displays (FEDs), and electro-luminescence displays (ELDs) have been developed to replace CRTs. Of these types of flat panel displays, LCD devices have many advantages, such as high resolution, light weight, thin profile, compact size, and low voltage power supply requirements.

In general, an LCD device includes two substrates that are spaced apart and opposed to each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes proportionally with the intensity of the induced electric field in the direction of the induced electric field, thereby changing the light transmissivity of the LCD device. Thus, the LCD device displays images by varying the intensity of the induced electric field.

Recently, active matrix type LCD devices, which include thin film transistors (TFTs) and pixel electrodes arranged in matrix form, have been commonly used. Hydrogenated amorphous silicon (a-Si:H) has been used as an active layer for the TFT because of its low temperature applications as well as its relatively low price. However, because the atoms in the hydrogenated amorphous silicon are randomly arranged, the bonds between the silicon atoms are weak and dangling. Accordingly, when light is irradiated or electric field is induced, the silicon atom is in a quasi-stable state, thereby making the TFT unstable. The weak bonds also cause poor electric properties. For example, the field effect mobility value is as low as 0.1 to 1.0 cm2/V·sec. Therefore, TFTs having amorphous silicon cannot reliably be used as a driving circuit.

In contrast, poly-crystalline silicon can be used for a driving circuit since poly-crystalline silicon has higher field effect mobility than amorphous silicon. Therefore, compact-sized LCD devices can be made when a driving circuit using poly-crystalline silicon is formed directly on the substrate.

FIG. 1 is a plan view illustrating an array substrate for an LCD device having a driving circuit formed directly thereon according to a related art. As illustrated in FIG. 1, a substrate 2 of the related art LCD device includes a display region "D" and a non-display region "N." In the display region D, a plurality of pixel regions "P" are arranged in matrix form. In each pixel region P, a pixel TFT "T" and a pixel electrode 78 are formed.

Gate lines "GL" extend along a first direction, and data lines "DL" extend along a second direction perpendicular to the first direction. The intersecting regions of the gate and data lines GL and DL define the pixel regions P.

In the non-display region N, gate and data driving portions "GP" and "DP" are formed. The gate driving portion GP is disposed on a first side of the substrate 2 and supplies gate signals to the gate lines GL. The data driving portion DP is disposed on a second side of the substrate 2 and supplies data signals to the data lines DL. The gate and data driving portions GP and DP are connected to signal input terminals "OL." The signal input terminals OL transfer external signals from an external driving circuit, such as control, gate, and data signals, to the gate and data driving portions GP and DP. The gate and data driving portions GP and DP adjust the gate and data signals from the external driving circuit based on the control signals, and supply the gate and data signals to each pixel region P. To do this, the gate and data driving portions GP and DP include a CMOS (a complementary metal-oxide semiconductor) as an inverter. The CMOS used as the driving device includes an n-type TFT using an electron as a carrier, and a p-type TFT using a hole as a carrier. The n-type and p-type TFTs are formed directly on the substrate 2 using the poly-crystalline silicon. In the related art LCD device, the pixel TFT "T" and the driving device (i.e., the CMOS) are formed with the same processes.

FIG. 2 is a plan view illustrating a pixel of an array substrate for an LCD device according to the related art. As illustrated in FIG. 2, gate and data lines GL and DL cross each other to define a pixel region P on a substrate 2. A pixel TFT T is disposed at a crossing portion of the gate and data lines GL and DL. The pixel TFT T includes an active layer 14 made of poly-crystalline silicon, a gate electrode 32, and source and drain electrodes 70 and 72, respectively, contacting the active layer 14. A pixel electrode 78 contacting the drain electrode 72 is disposed in the pixel region P. A storage capacitor "$C_{ST}$" is also disposed in the pixel region P. The storage capacitor $C_{ST}$ includes a poly-crystalline silicon pattern 76 as a first electrode and a storage line 34 extending across the pixel region P as a second electrode.

Hereinafter, a method of fabricating the array substrate for the related art LCD device will be explained. FIGS. 3A and 3B are cross-sectional views illustrating a driving region and a pixel region, respectively, of an array substrate for the related art LCD device in a first mask process. The driving region is a region where the driving device, i.e., the CMOS, of the gate and data driving portions of FIG. 1 is formed.

As illustrated in FIGS. 3A and 3B, a buffer layer 4 is formed on an entire surface of the substrate 2. The buffer layer 4 is made of silicon oxide ($SiO_2$). Then, with a first mask, active patterns 10, 12, 14, and a poly-crystalline silicon pattern 16 are formed on the buffer layer 2. In particular, first and second active patterns 10 and 12 are formed in the n-type and p-type driving regions "NR" and "PR" of the driving region "DA," respectively, and a third active pattern 14 is formed in a switching region "C" of the pixel region P. The poly-crystalline silicon pattern 16 is formed in a storage region "ST" of the pixel region P. The poly-crystalline silicon pattern 16 is extended from the third active pattern 14.

FIGS. 4A and 4B are cross-sectional views illustrating a driving region and a pixel region, respectively, of an array substrate for the related art LCD device in a second mask process. First, a photoresist is deposited on the substrate 2 to form a photoresist layer. Then, with a second mask, the photoresist layer is patterned to form first, second, and third photoresist patterns 20, 22, and 24 on the first, second, and third active patterns 10, 12, and 14, respectively, as illustrated in FIGS. 4A and 4B. The poly-crystalline silicon pattern 16 is left exposed. Then, the poly-crystalline silicon pattern 16 is doped with n+ (high concentration n-type) or p+ (high concentration p-type) impurity ions. The doped poly-crystalline silicon pattern 16 functions as a first electrode of the storage capacitor ($C_{ST}$ of FIG. 2). Thereafter, the first to third photoresist patterns 20, 22 and 24 are removed.

FIGS. 5A and 5B are cross-sectional views illustrating a driving region and a pixel region, respectively, of an array substrate for the related art LCD device in a third mask process. As illustrated in FIGS. 5A and 5B, a gate insulator 26 is formed on the entire substrate 2 having the active patterns 10, 12, and 14. The gate insulator 26 is made of an inorganic insulating material, such as silicon nitride (SiNx) and silicon oxide ($SiO_2$). Then, a conductive material is deposited on the gate insulator 26 to form a conductive material layer. With a third mask, the conductive material layer is patterned to form first, second, and third gate electrodes 28, 30, and 32, corresponding to the first, second, and third active patterns 10, 12, and 14, respectively. The conductive material includes aluminum (Al) and aluminum alloy (AlNd). In the same process of forming the gate electrodes 28, 30, and 32, a storage line 34 overlapping the poly-crystalline silicon pattern 16 is formed. The storage line 34 and the poly-crystalline silicon pattern 16 overlapping each other define the storage capacitor $C_{ST}$.

The first to third active patterns 10, 12, and 14 include active regions "A1," "A2," and "A3," respectively, at center portions, source regions "S1," "S2," and "S3," respectively, at first side portions, and drain regions "D1," "D2," and "D3," respectively, at second side portions. In particular, the first and third active patterns 10 and 14 further include lightly-doped drain (LDD) regions "F1," "F2," "F3," and "F4."

The first to third active regions A1, A2, and A3 correspond to the first to third gate electrodes 28, 30, and 32, respectively. The first and second LDD regions F1 and F2 are disposed between the first active region A1 and the first source region S1 and between the first active region A1 and the first drain region D1, respectively. The third and fourth LDD regions F3 and F4 are disposed between the third active region A3 and the third source region S3 and between the third active region A3 and the third drain region D3, respectively. The substrate 2 is doped with n– (low concentration n-type) impurity ions. Accordingly, the source regions S1, S2, and S3, the drain regions D1, D2, and D3, and the LDD regions F1, F2, F3, and F4 are doped with the n– impurity ions.

FIGS. 6A and 6B are cross-sectional views illustrating a driving region and a pixel region, respectively, of an array substrate for the related art LCD device in a fourth mask process. A photoresist is deposited on the substrate 2 having the n– doped active patterns 10, 12, and 14. With a fourth mask, the photoresist layer is patterned to form first, second, and third photoresist patterns 36, 38, and 40 covering the first, second, and third gate electrodes 28, 30, and 32, respectively, as illustrated in FIGS. 6A and 6B.

More particularly, the first photoresist pattern 36 covers the first active region A1 and the first and second LDD regions F1 and F2. The second photoresist pattern 38 covers the entire second active pattern 12. The third photoresist pattern 40 covers the third active region A3 and the third and fourth LDD regions F3 and F4. In other words, the first source and drain regions S1 and D1 and the third source and drain regions S3 and D3 are not covered by the first and third photoresist patterns 36 and 40.

Then, the substrate 2 is doped with n+ impurity ions. Accordingly, the first source and drain regions S1 and D1 and the third source and drain regions S3 and D3 are doped with n+ impurity ions to function as ohmic contact layers. Then, the first to third photoresist patterns 36, 38, and 40 are removed.

FIGS. 7A and 7B are cross-sectional views illustrating a driving region and a pixel region, respectively, of an array substrate for the related art LCD device in a fifth mask process. As illustrated in FIGS. 7A and 7B, first and second photoresist patterns 42 and 44 are formed on the n-type driving region NR and the pixel region P using a fifth mask. Particularly, the first photoresist pattern 42 covers the entire first active pattern 10, and the second photoresist pattern 44 covers both the third active pattern 14 and the poly-crystalline silicon pattern 16. The second active pattern 12 is left exposed. Then, the substrate 2 is doped with p+ impurity ions. Accordingly, the second source and drain regions S2 and D2 are doped with p+ impurity ions to function as ohmic contact layers. Then, the first and second photoresist patterns 42 and 44 are removed.

FIGS. 8A and 8B are cross-sectional views illustrating a driving region and a pixel region, respectively, of an array substrate for the related art LCD device in a sixth mask process. An interlayer insulating film 46 is formed on the substrate 2 after the p+ doping process was conducted. With a sixth mask, the gate insulator 26 and the interlayer insulating film 46 are patterned to form first and second contact holes 50 and 52 exposing the first source and drain regions S1 and D1, respectively, third and fourth contact holes 54 and 56 exposing the second source and drain regions S2 and D2, respectively, and fifth and sixth contact holes 58 and 60 exposing the third source and drain regions S3 and D3, respectively, as illustrated in FIGS. 8A and 8B.

FIGS. 9A and 9B are cross-sectional views illustrating a driving region and a pixel region, respectively, of an array substrate for the related art LCD device in a seventh mask process. With a seventh mask, first, second, and third source electrodes 62, 66, 70 and first, second, and third drain electrodes 64, 68, and 72 are formed as illustrated in FIGS. 9A and 9B. The first source and drain electrodes 62 and 64 contact the first source and drain regions S1 and D1 through the first and second contact holes (50 and 52 of FIG. 8A). Similarly, the second source and drain electrodes 66 and 68 contact the second source and drain regions S2 and D2 through the third and fourth contact holes (54 and 56 of FIG. 8A), and the third source and drain electrodes 70 and 72 contact the third source and drain regions S3 and D3 through the fifth and sixth contact holes (58 and 60 of FIG. 8B). Using the above-described processes, an n-type TFT, a p-type TFT, and a pixel TFT are formed in the n-type region NR, the p-type region PR, and the pixel region P, respectively.

FIGS. 10A and 10B are cross-sectional views illustrating a driving region and a pixel region, respectively, of an array substrate for the related art LCD device in a eighth mask process. As illustrated in FIGS. 10A and 10B, a passivation layer 74 is formed on the substrate 2 having the source and drain electrodes 62, 64, 66, 68, 70, and 72. Then, with a eighth mask, the passivation layer 74 is patterned to form a drain contact hole 76 exposing the third drain electrode 72.

FIGS. 11A and 11B are cross-sectional views illustrating a driving region and a pixel region, respectively, of an array substrate for the related art LCD device in a ninth mask process. A transparent conductive material is deposited on the passivation layer 74. Then, with a ninth mask, the transparent conductive material layer is patterned to form a pixel electrode 78 in the pixel region P as illustrated in FIGS. 11A and 11B. The pixel electrode 78 contacts the third drain electrode 72 through the drain contact hole 76.

As explained above, both the driving device having the n-type and p-type TFTs and the pixel TFT using the polycrystalline silicon are formed on the same substrate using the same processes. However, the method of fabricating the related art array substrate needs many mask processes, thereby increasing the time and cost for fabricating the array substrate according to the related art.

SUMMARY OF THE INVENTION

Accordingly, the present invention is directed to an LCD device and a method of fabricating the same that substantially obviates one or more problems due to limitations and disadvantages of the related art.

It is an object of the present invention to provide an LCD device and a method of fabricating the same using reduced number of mask processes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating an LCD device includes forming first, second, and third active patterns on a substrate having a pixel region and a driving region, wherein the first and second active patterns are in the driving region and the third active pattern is in the pixel region, the first, second, and third active patterns each having an active region, a source region, and a drain region with the source and drain regions on opposing sides of the active region, forming a gate insulator on the first, second, and third active patterns, forming first, second, and third gate electrodes on the gate insulator, wherein the first, second, and third gate electrodes correspond to the active regions of the first, second, and third active patterns, respectively, doping the source and drain regions of the first, second, and third active patterns with n− ions using the first, second, and third gate electrodes as a doping mask, doping the n− doped source and drain regions of the second active pattern with p+ ions, forming an interlayer insulating film on the first, second, and third gate electrodes and patterning the interlayer insulating film to form contact holes exposing each source and drain regions of the first, second, and third active patterns, and doping the source and drain regions of the first, second, and third active patterns with n+ ions through the contact holes.

In another aspect, an LCD device includes a substrate having a pixel region and a driving region, first, second, and third active patterns formed on the substrate, wherein the first and second active patterns are in the driving region and the third active pattern is in the pixel region, the first, second, and third active patterns each having an active region, a source region, and a drain region with the source and drain regions on opposing sides of the active region, each of the first and third active patterns further including first and second LDD regions and first and second LDE regions, wherein the first LDD region is between the active region and the source region, the second LDD region is between the active region and drain region, the first LDE region is at the outer periphery of the source region, and the second LDE region is at the outer periphery of the drain region, a gate insulator on the first, second, and third active patterns, first, second, and third gate electrodes on the gate insulator, wherein the first, second, and third gate electrodes correspond to the active regions of the first, second, and third active patterns, respectively, an interlayer insulating film having contact holes exposing each source and drain regions of the first, second, and third active patterns, first, second, and third source electrodes contacting the source region of the first, second, and third active patterns, respectively, through corresponding contact holes, and first, second, and third drain electrodes contacting the drain region of the first, second, and third active patterns, respectively, through corresponding contact holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 7A and 7B are cross-sectional views illustrating a driving region and a pixel region, respectively, of an array substrate for the related art LCD device in a fifth mask process according to the related art;

FIGS. 8A and 8B are cross-sectional views illustrating a driving region and a pixel region, respectively, of an array substrate for the related art LCD device in a sixth mask process according to the related art;

FIGS. 16A and 16B are cross-sectional views illustrating a driving region and a pixel region, respectively, of an array substrate for the LCD device in a process of forming a gate insulator according to an exemplary embodiment of the present invention;

It will be apparent to those skilled in the art that various modifications and variations can be made in the LCD device and the method of fabricating the same of the present invention without departing from the spirit or scope of the invention. Thus, it is intended that the present invention cover the modifications and variations of this invention provided they come within the scope of the appended claims and their equivalents.

DETAILED DESCRIPTION OF THE PREFERRED EMBODIMENTS

Reference will now be made in detail to the preferred embodiments of the present invention, examples of which are illustrated in the accompanying drawings.

An LCD device according to an exemplary embodiment of the present invention may have portions that are similar to the related art LCD device. Accordingly, detailed explanations to similar portions of the related art LCD device will be omitted for purposes of brevity.

Figure 1:
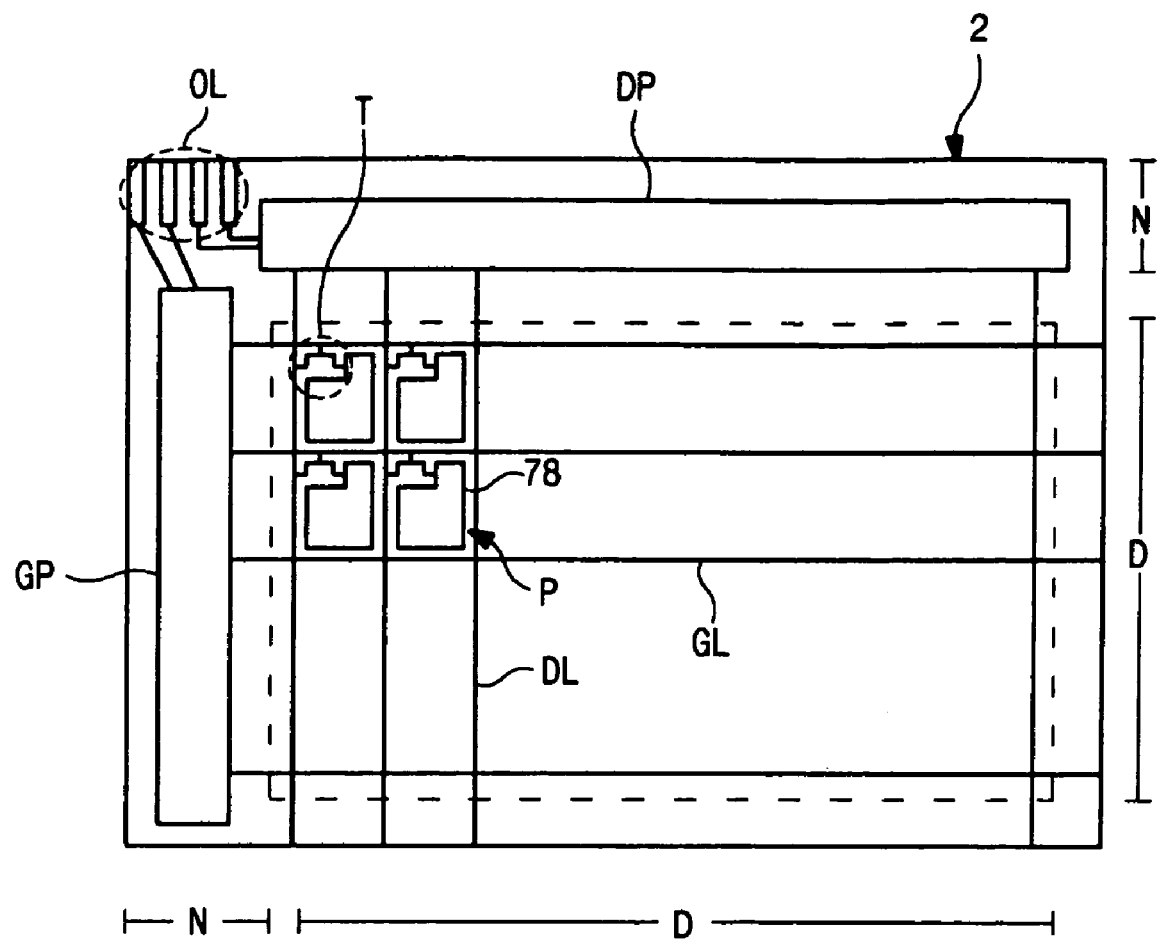
FIG. 1 is a plan view illustrating an array substrate for an LCD device according to the related art.
Figure 2:
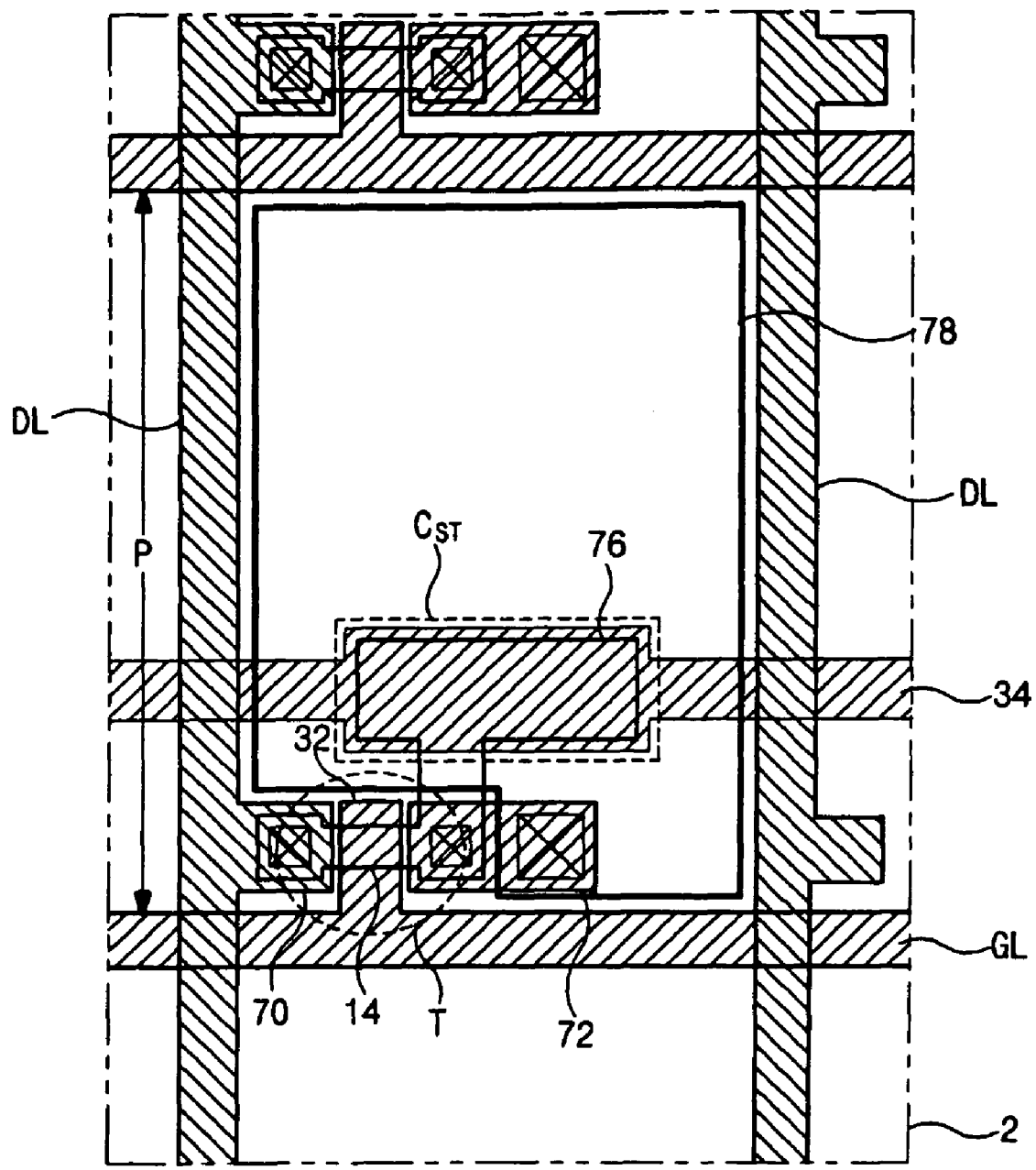
FIG. 2 is a plan view illustrating a pixel of an array substrate for an LCD device according to the related art.
Figure 3A:
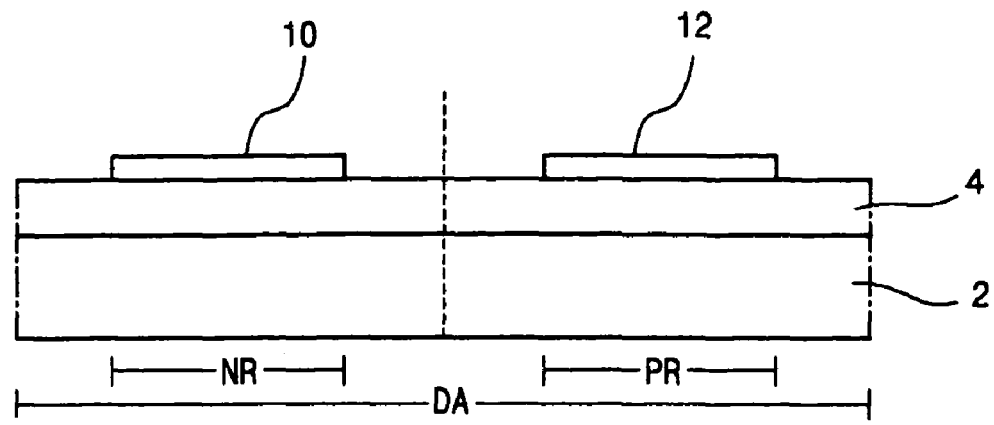
FIGS. 3A and 3B are cross-sectional views illustrating a driving region and a pixel region, respectively, of an array substrate for the related art LCD device in a first mask process according to the related art.
Figure 3B:
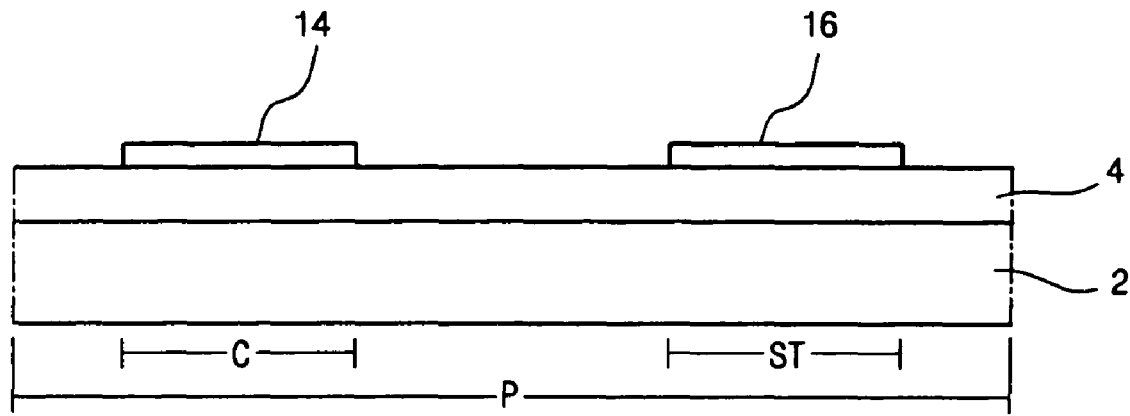
Figure 4A:
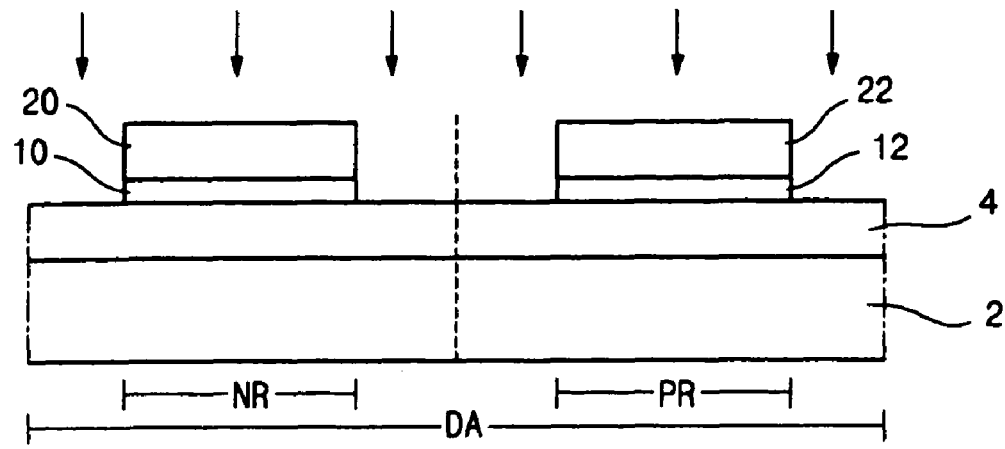
FIGS. 4A and 4B are cross-sectional views illustrating a driving region and a pixel region, respectively, of an array substrate for the related art LCD device in a second mask process according to the related art.
Figure 4B:
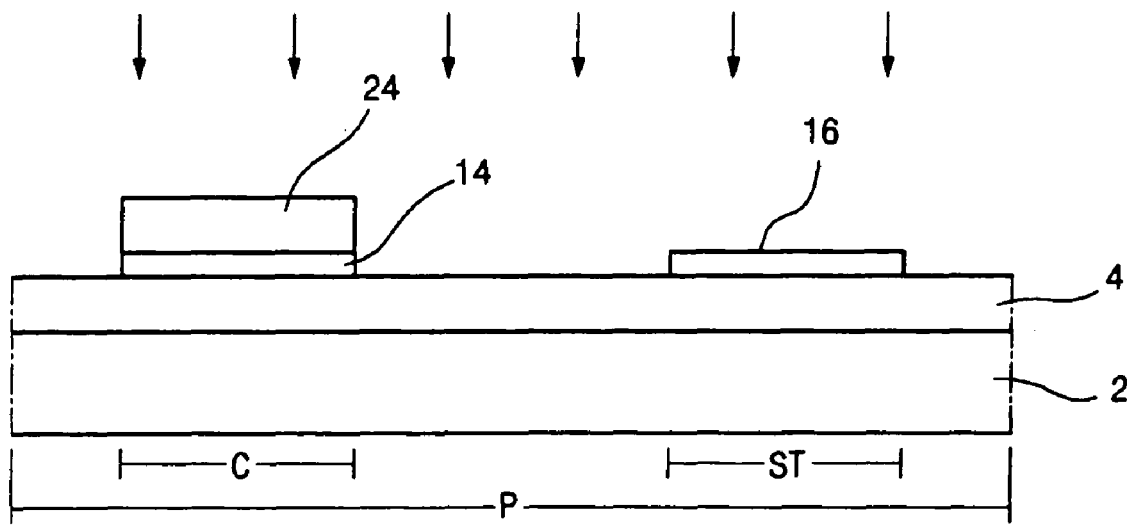
Figure 5A:
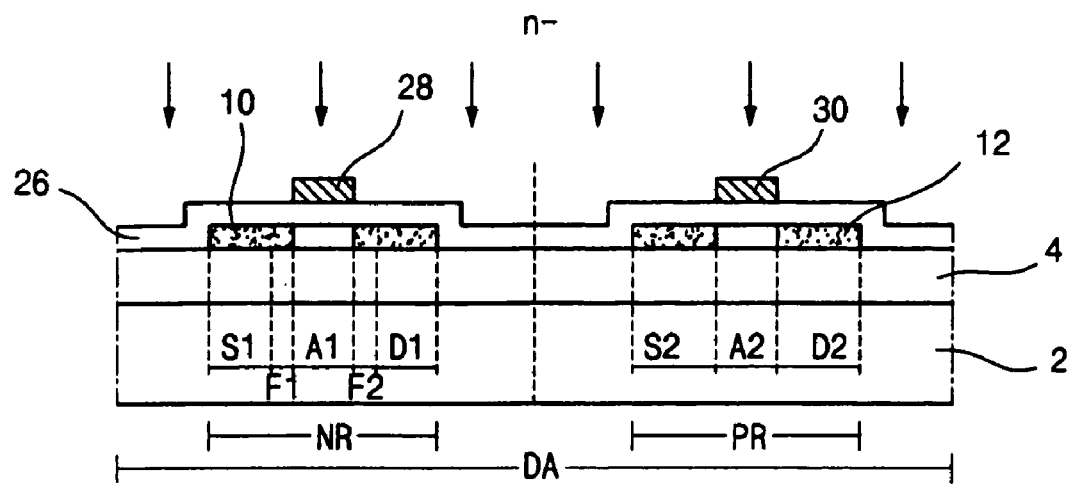
FIGS. 5A and 5B are cross-sectional views illustrating a driving region and a pixel region, respectively, of an array substrate for the related art LCD device in a third mask process according to the related art.
Figure 5B:
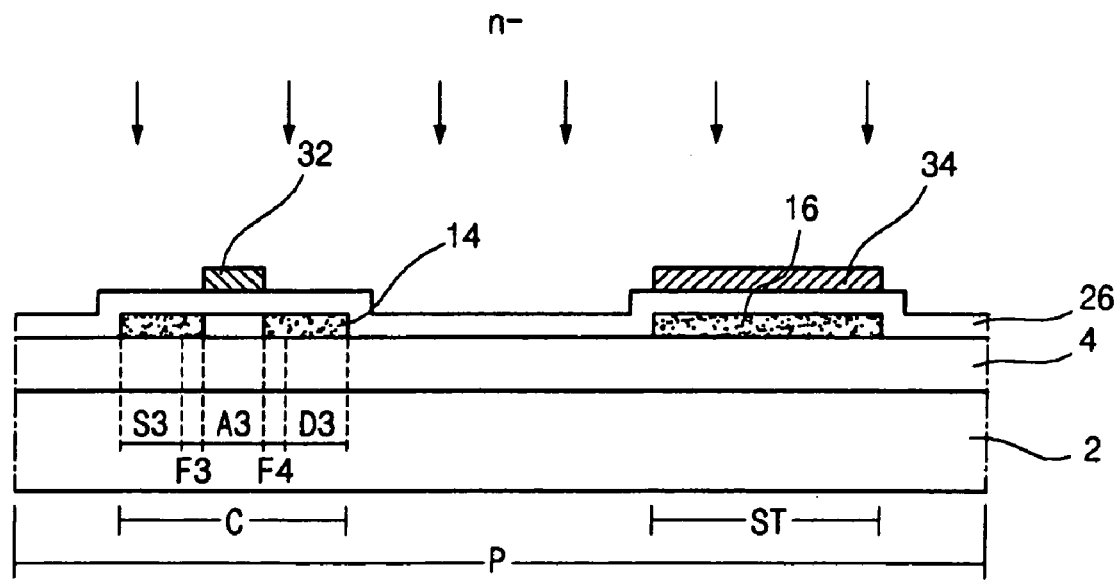
Figure 6A:
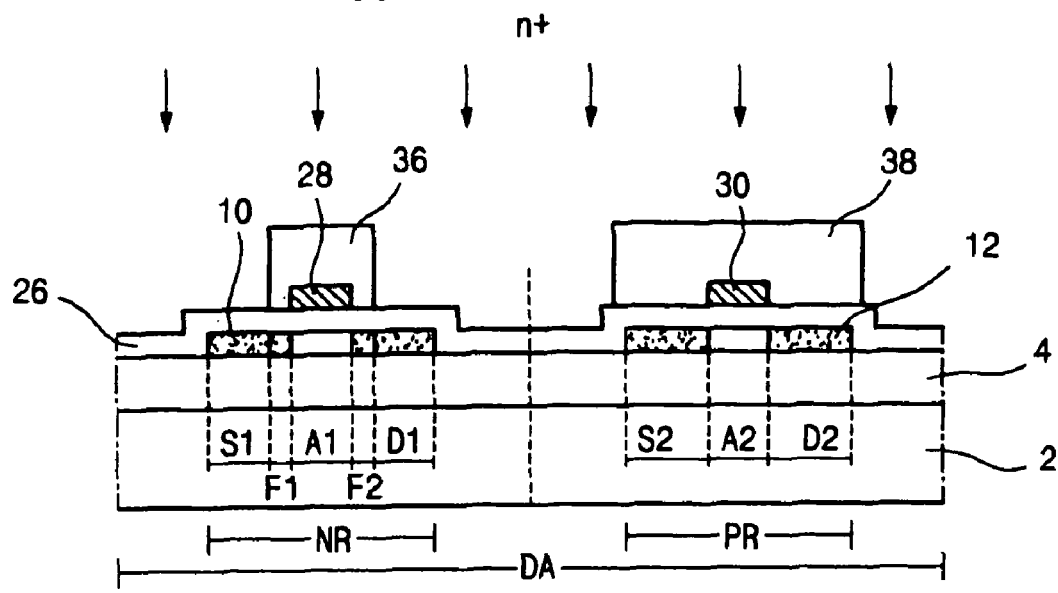
FIGS. 6A and 6B are cross-sectional views illustrating a driving region and a pixel region, respectively, of an array substrate for the related art LCD device in a fourth mask process according to the related art.
Figure 6B:
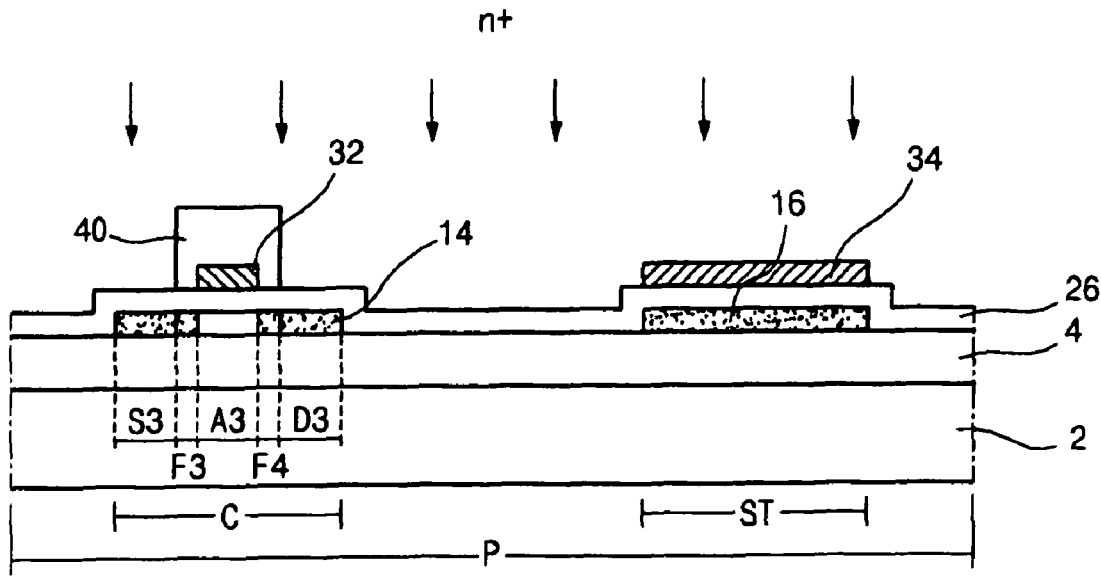
Figure 9A:
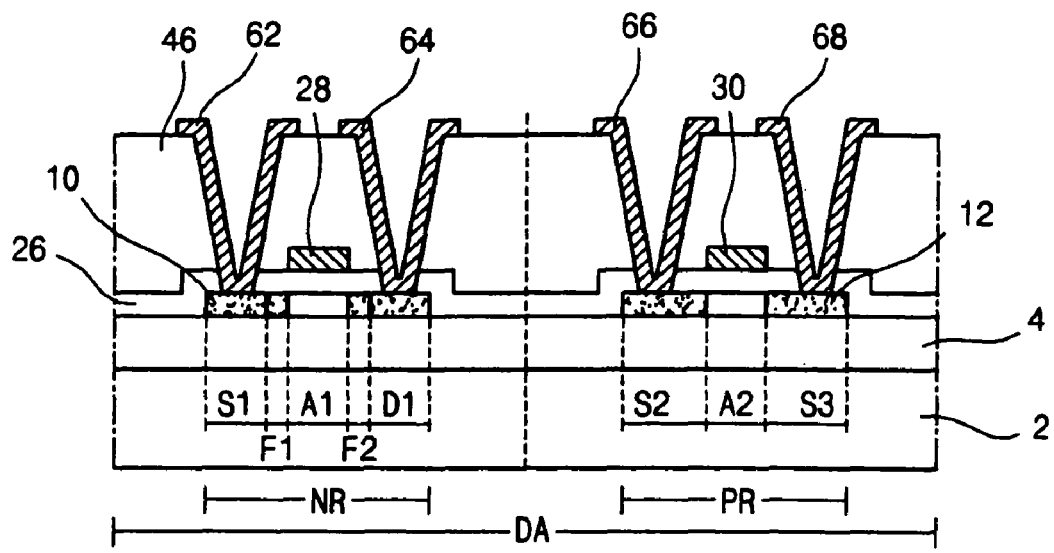
FIGS. 9A and 9B are cross-sectional views illustrating a driving region and a pixel region, respectively, of an array substrate for the related art LCD device in a seventh mask process according to the related art.
Figure 9B:
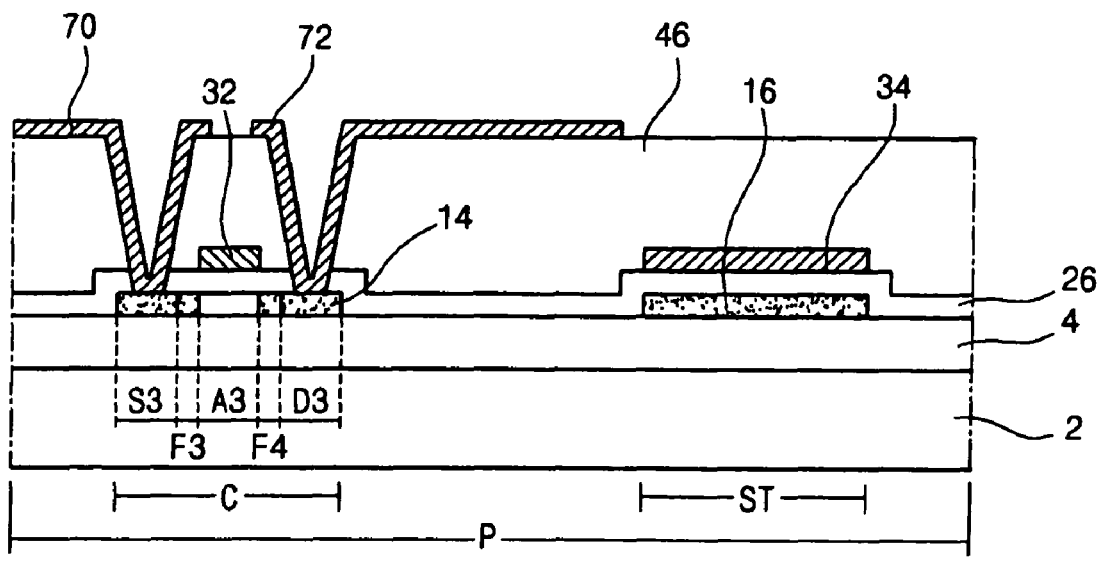
Figure 10A:
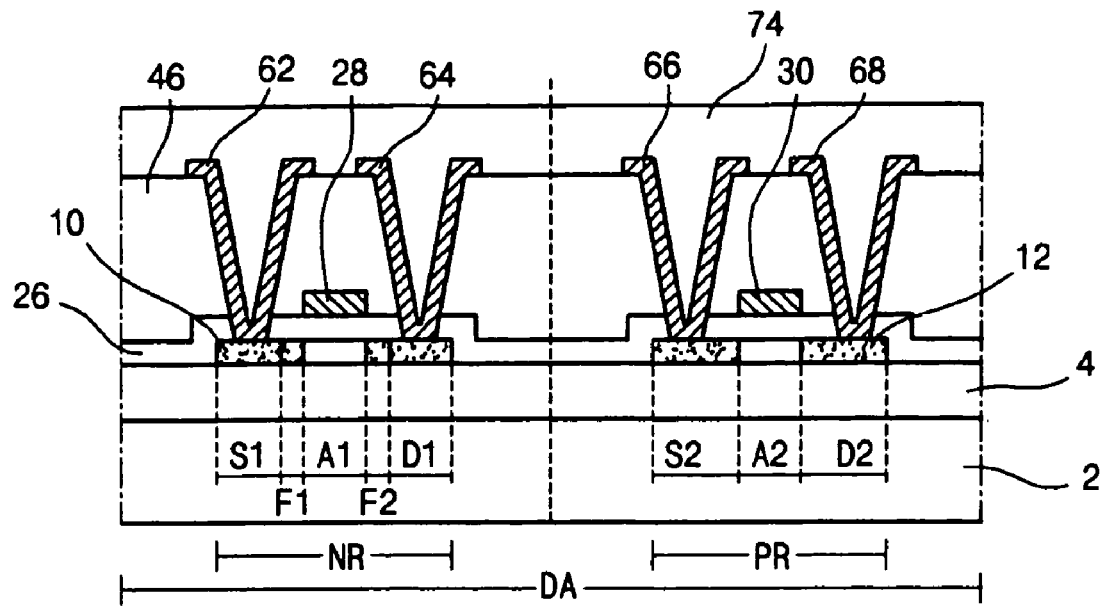
FIGS. 10A and 10B are cross-sectional views illustrating a driving region and a pixel region, respectively, of an array substrate for the related art LCD device in a eighth mask process according to the related art.
Figure 10B:
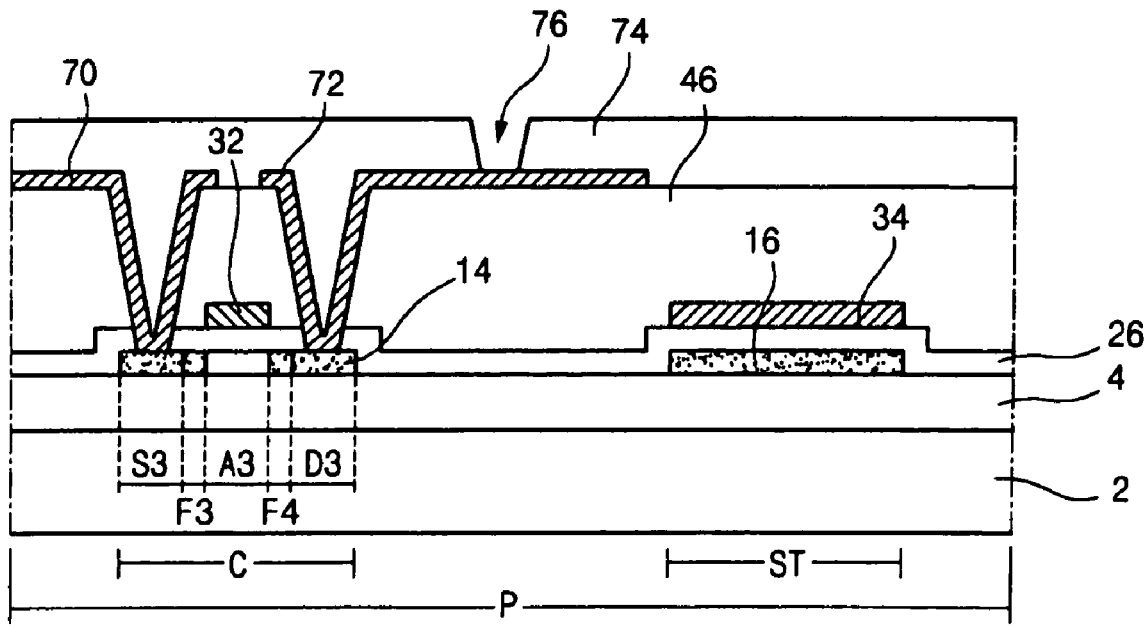
Figure 11A:
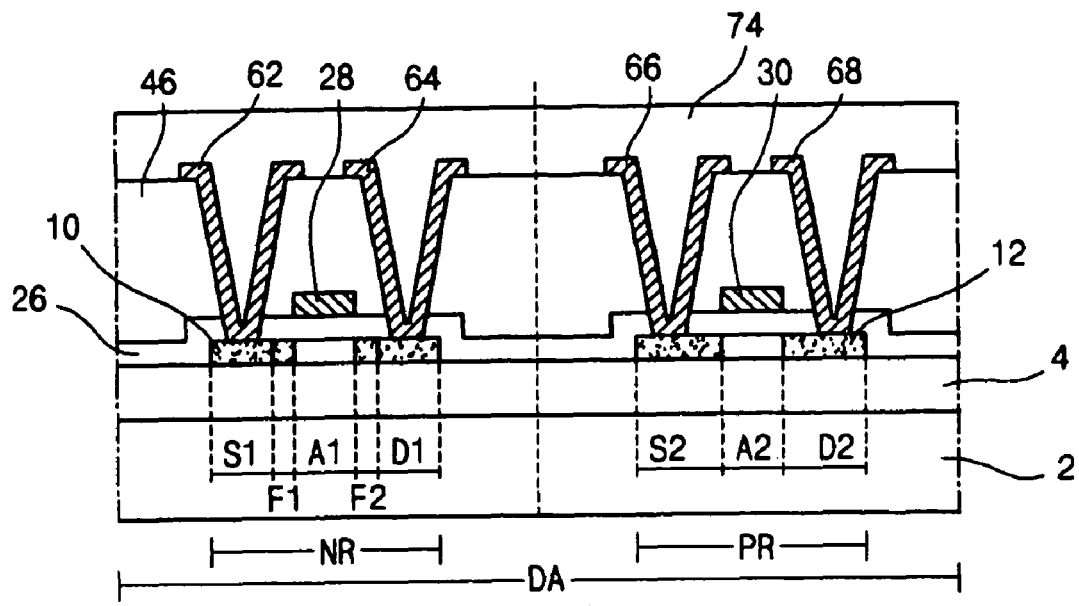
FIGS. 11A and 11B are cross-sectional views illustrating a driving region and a pixel region, respectively, of an array substrate for the related art LCD device in a ninth mask process according to the related art.
Figure 11B:
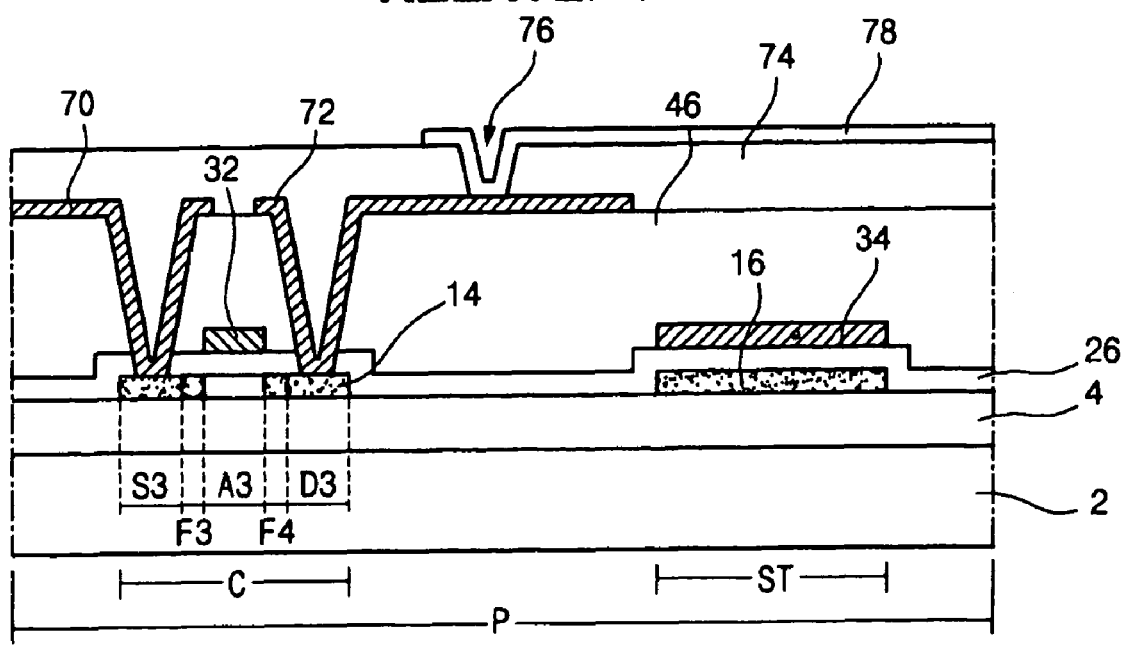
Figure 12A:
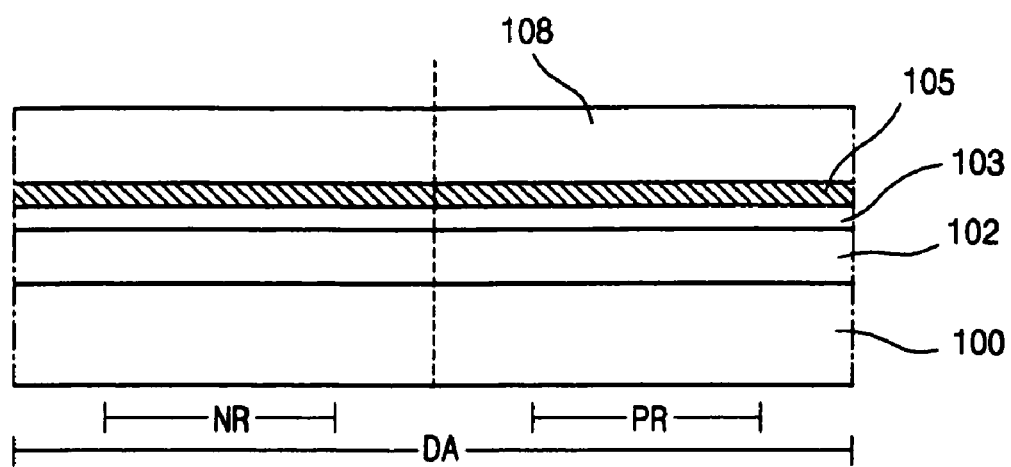
FIGS. 12A and 12B are cross-sectional views illustrating a driving region and a pixel region, respectively, of an array substrate for the LCD device in a process of a forming a poly-crystalline silicon layer and a conductive layer according to an exemplary embodiment of the present invention.
Figure 12B:
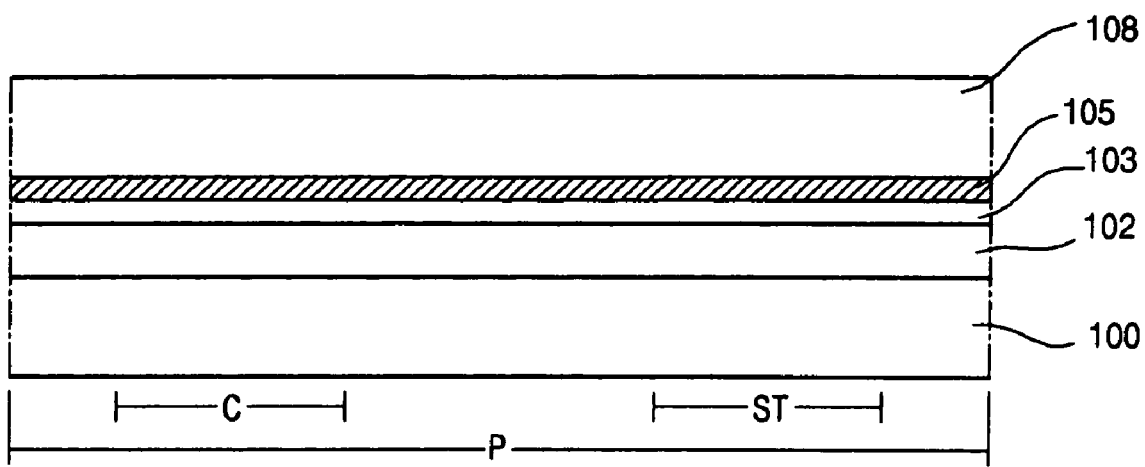

FIGS. 12A and 12B are cross-sectional views illustrating a driving region and a pixel region, respectively, of an array substrate for an exemplary LCD device of the present invention in a process of a forming a poly-crystalline silicon layer and a conductive layer according to an exemplary embodiment of the present invention. As illustrated in FIGS. 12A and 12B, a buffer layer 102 is formed on an entire surface of substrate 100. The buffer layer 102 is made of one of silicon oxide ($SiO_2$) and silicon nitride (SiNx). However, other materials may be used as appropriate. Then, a poly-crystalline silicon layer 103 is formed on the buffer layer 102. The poly-crystalline silicon layer 103 may be formed by depositing amorphous silicon, dehydrogenating the amorphous silicon, and crystallizing the amorphous silicon with heat or laser. Then, a conductive material layer 105, such as a metal layer, is formed on the poly-crystalline silicon layer 103. Thereafter, a photoresist layer 108 is formed on the conductive material layer 105.

Figure 13A:
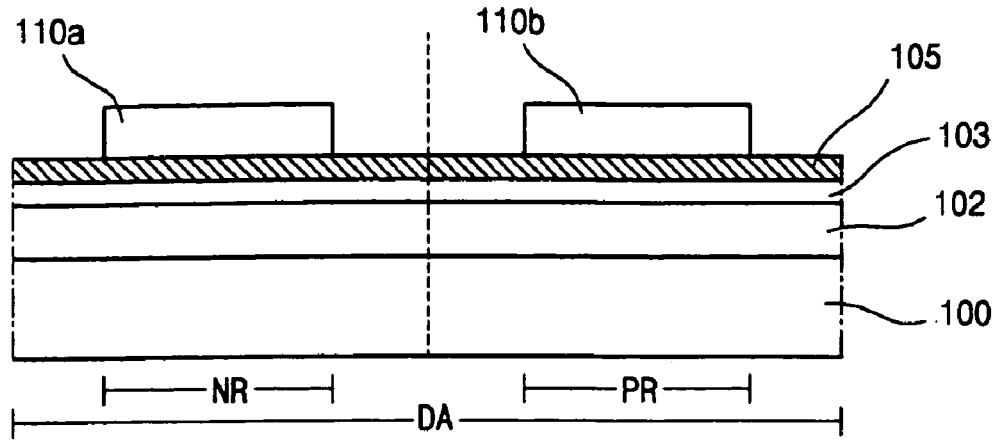
FIGS. 13A and 13B are cross-sectional views illustrating a driving region and a pixel region, respectively, of an array substrate for the LCD device in a first mask process according to an exemplary embodiment of the present invention.
Figure 13B:
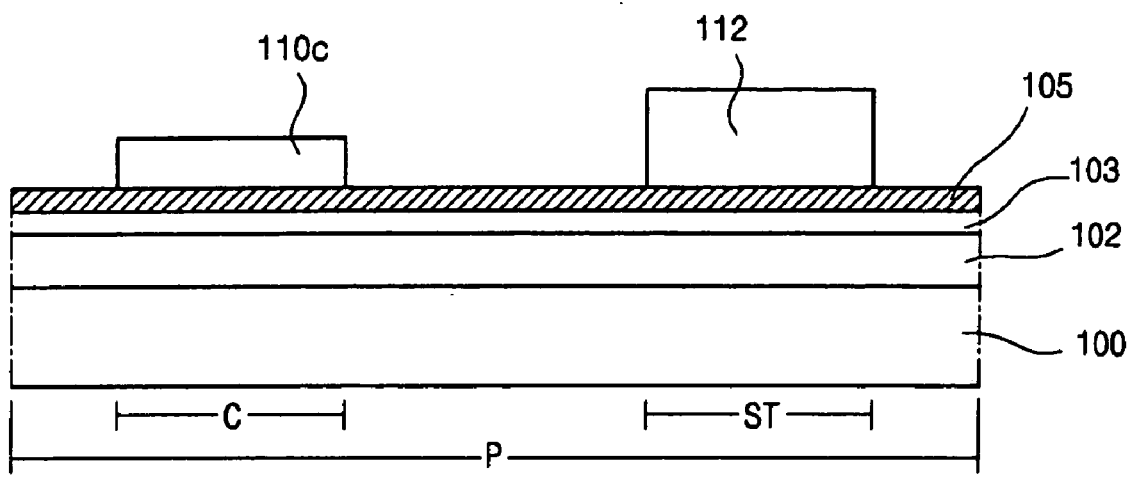

FIGS. 13A and 13B are cross-sectional views illustrating a driving region and a pixel region, respectively, of an array substrate for the LCD device in a first mask process according to an exemplary embodiment of the present invention. A first mask (not shown) is arranged over the photoresist layer (108 of FIGS. 12A and 12B). The first mask includes a transmitting portion, a blocking portion and a semi-transmitting portion. When the photoresist is positive type, the semi-transmitting portion corresponds to n-type and p-type driving regions NR and PR and a switching region C. The blocking portion corresponds to a storage capacitor region ST, and the transmitting portion corresponds to all other regions.

Then, the photoresist layer is light-irradiated with the first mask and developed to form first, second, third, and fourth photoresist patterns 110a, 110b, 110c, and 112 as illustrated in FIGS. 13A and 13B. Accordingly, after developing the photoresist, the first, second, and third photoresist patterns 110a, 110b, and 110c corresponding to the semi-transmitting portion have a first height, and the fourth photoresist pattern 112 corresponding to the blocking portion has a second height that is greater than the first height.

Figure 14A:
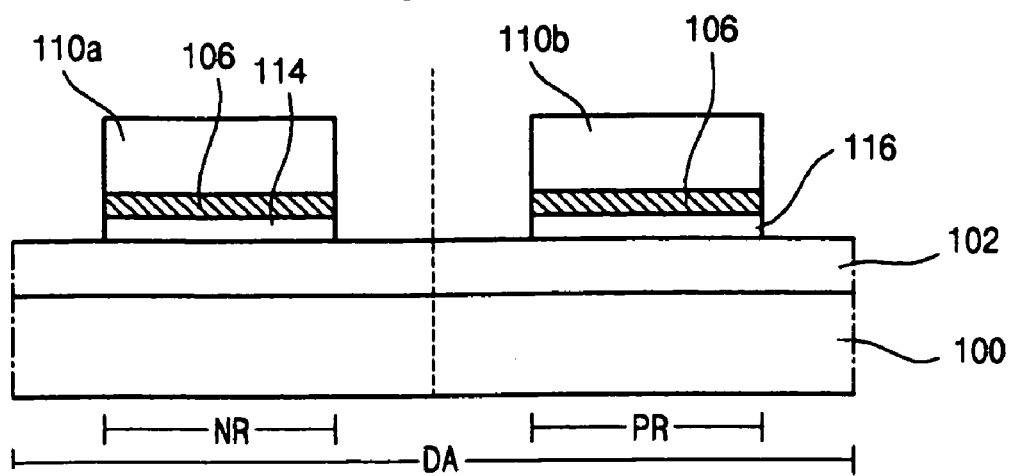
FIGS. 14A and 14B are cross-sectional views illustrating a driving region and a pixel region, respectively, of an array substrate for the LCD device in a process of patterning the poly-crystalline silicon layer and the conductive layer according to an exemplary embodiment of the present invention.
Figure 14B:
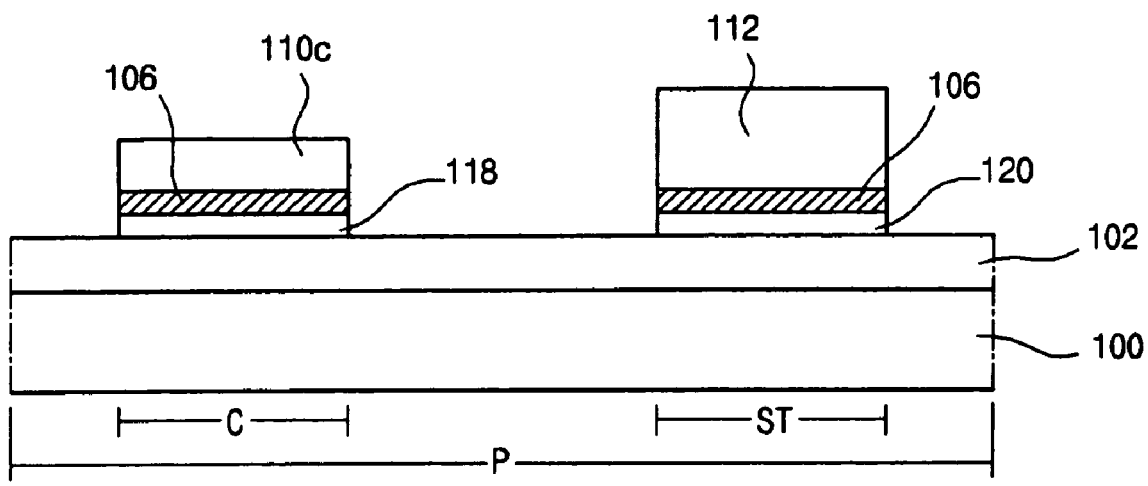

FIGS. 14A and 14B are cross-sectional views illustrating a driving region and a pixel region, respectively, of an array substrate for the LCD device in a process of patterning the poly-crystalline silicon layer and the conductive layer according to an exemplary embodiment of the present invention. As illustrated in FIGS. 14A and 14B, the conductive material layer (105 of FIGS. 13A and 13B) and the poly-crystalline silicon layer (103 of FIGS. 13A and 13B) are patterned by using the first to fourth photoresist patterns 110a, 110b, 110 c, and 112 to form a conductive pattern 106, and first, second, and third active patterns 114, 116, and 118, and a poly-crystalline silicon pattern (i.e., storage pattern) 120 below the conductive pattern 106. For example, the conductive material layer 105 may be wet-etched, and the poly-crystalline silicon layer 103 may be dry-etched. The first, second, and third active patterns 114, 116, and 118 are formed in the n-type driving region NR, the p-type driving region PR, and the switching region C, respectively. The polycrystalline pattern 120 is formed in the storage region ST. The poly-crystalline silicon pattern 120 is extended from the third active pattern 118.

Figure 15A:
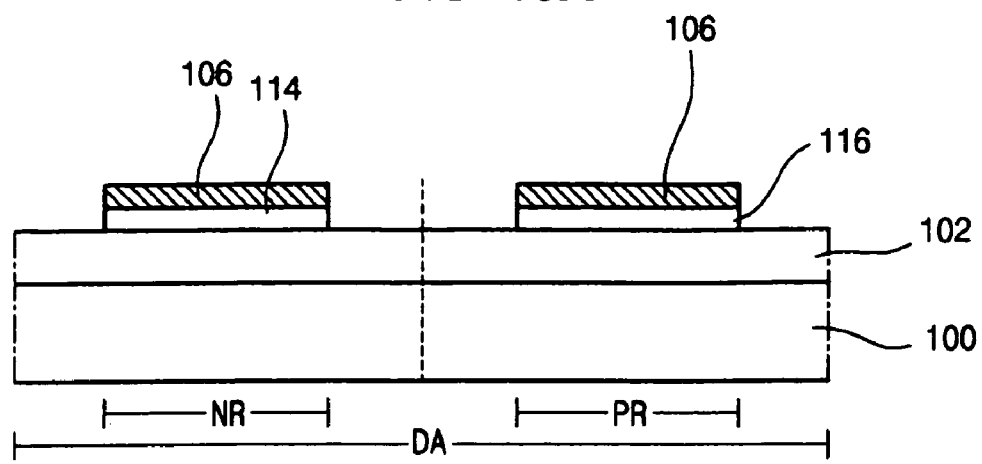
FIGS. 15A and 15B are cross-sectional views illustrating a driving region and a pixel region, respectively, of an array substrate for the LCD device in a process of removing the first to third photoresist patterns according to an exemplary embodiment of the present invention.
Figure 15B:
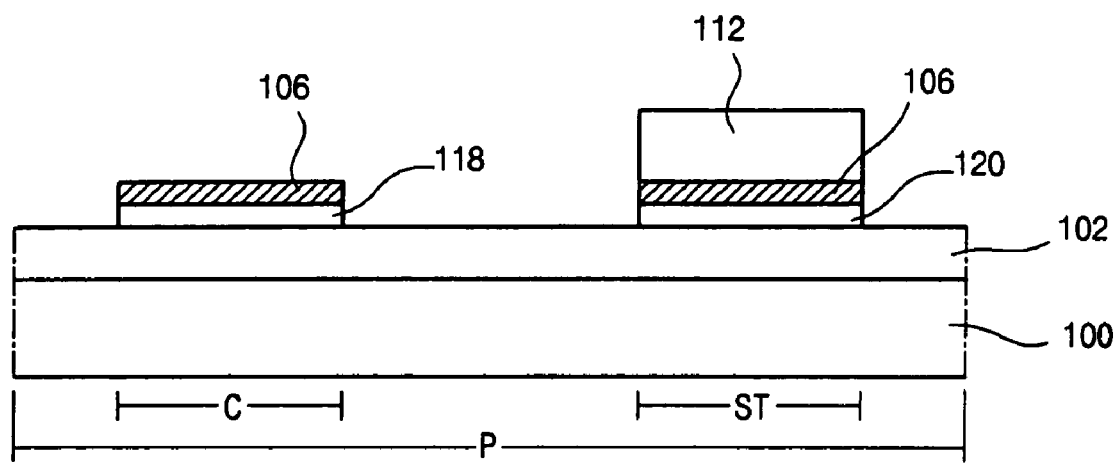

FIGS. 15A and 15B are cross-sectional views illustrating a driving region and a pixel region, respectively, of an array substrate for the LCD device in a process of removing the first to third photoresist patterns according to an exemplary embodiment of the present invention. As illustrated in FIGS. 15A and 15B, the first to third photoresist patterns (110a, 110b, and 110c of FIGS. 14A and 14B) are completely removed. For example, an ashing process may be used to remove the first to third photoresist patterns. During the removing process, the fourth photoresist pattern 112 is only partially removed because the fourth photoresist pattern 112 has a height greater than the first to third photoresist patterns. Therefore, while the removing process completely removes the first to third photresist patters, a portion of the fourth photoresist pattern 112 will remain on the poly-crystalline silicon pattern 120 when the removing process ends.

Thereafter, the exposed conductive patterns 106 on the first to third active patterns 114, 116, and 118 are removed. The conductive pattern 106 on the poly-crystalline silicon pattern 120 is not removed during this process because the fourth photoresist pattern 112 was left covering the poly-crystalline silicon pattern 120. Once the conductive patterns 106 on the first to third active patterns 114, 116, and 118 are removed, the fourth photoresist pattern 112 is completely removed. The remaining conductive pattern 106 on the poly-crystalline silicon pattern 120 functions as a storage electrode hereinafter referred to as storage electrode 122. The poly-crystalline silicon pattern 120 is aligned with the storage electrode 122.

FIGS. 16A and 16B are cross-sectional views illustrating a driving region and a pixel region, respectively, of an array substrate for the LCD device in a process of forming a gate insulator according to an exemplary embodiment of the present invention. As illustrated in FIGS. 16A and 16B, a gate insulator 124 is formed on the entire substrate 100 having the storage electrode 122. The gate insulator 124 may be formed of an inorganic insulating material, such as silicon oxide ($SiO_2$) and silicon nitride (SiNx). However, other appropriate material may be used.

Figure 17A:
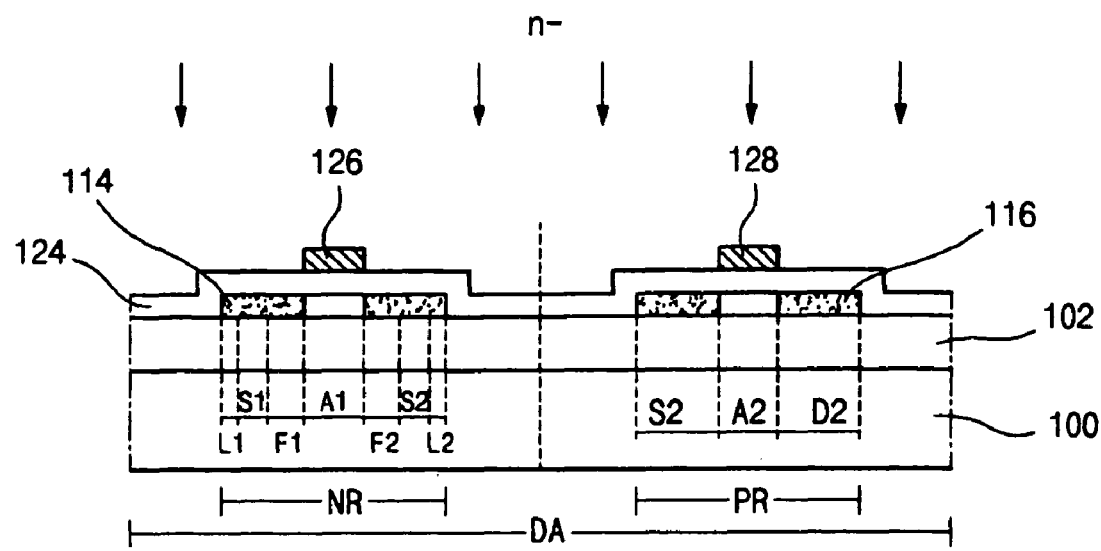
FIGS. 17A and 17B are cross-sectional views illustrating a driving region and a pixel region, respectively, of an array substrate for the LCD device in a second mask process according to an exemplary embodiment of the present invention.
Figure 17B:
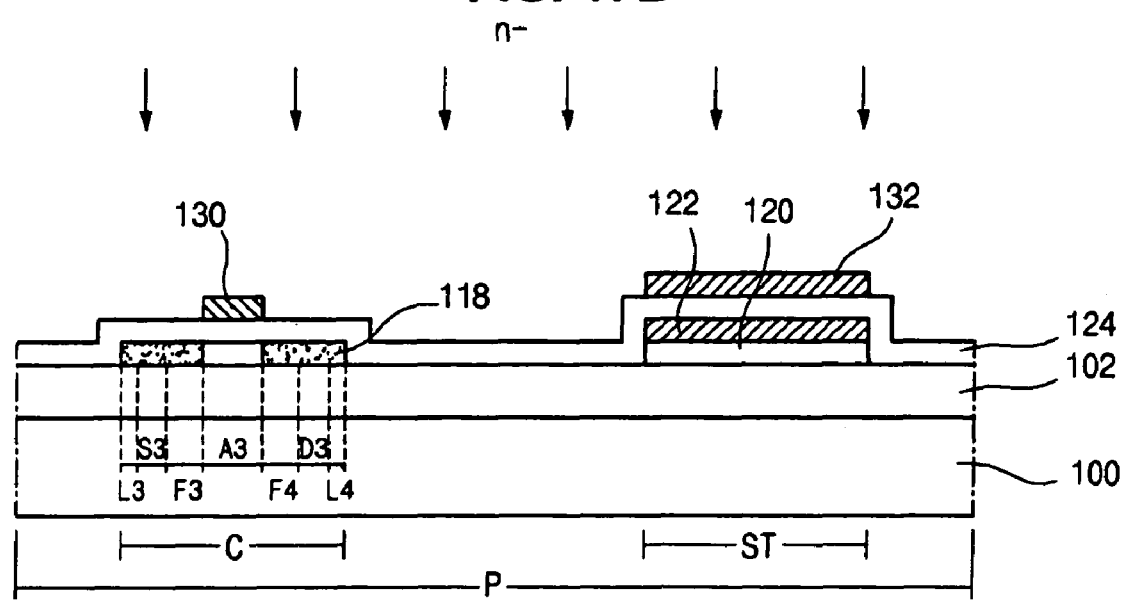

FIGS. 17A and 17B are cross-sectional views illustrating a driving region and a pixel region, respectively, of an array substrate for the LCD device in a second mask process according to an exemplary embodiment of the present invention. A conductive material is deposited on the gate insulator 124 and patterned with a second mask (not shown) to form first, second, and third gate electrodes 126, 128, and 130, respectively, and a storage line 132 as illustrated in FIGS. 17A and 17B. The conductive material may include aluminum (Al), aluminum alloy (AlNd), copper (Cu), molybdenum (Mo), tungsten (W), titanium (Ti) and chromium (Cr). However, other conductive material may be used as appropriate. The first, second, and third gate electrodes 126, 128, and 130, respectively, are formed in the n-type driving region NR, the p-type driving region PR, and the switching region C, respectively. The storage line 132 overlaps the storage electrode 122. Although not shown, a gate line connected to the third gate electrode 130 is formed in the same process of forming the gate electrodes 126, 128, and 130.

The first to third active patterns 114, 116, and 118 include active regions (i.e., "channel regions") A1, A2, and A3, respectively, at center portions of the corresponding active patterns. Source regions S1, S2, and S3 and corresponding drain regions D1, D2, and D3 are on opposing sides of corresponding active regions A1, A2, and A3, respectively. In particular, the first and third active patterns 114 and 118 further include lightly-doped drain (LDD) regions F1, F2 and F3, F4, respectively. In addition, the first and third active patterns 114 and 118 further include lightly-doped edge (LDE) regions L1, L2 and L3, L4, respectively.

The first to third active regions A1, A2, and A3 correspond to the first to third gate electrodes 126, 128, and 130, respectively. The first and second LDE regions F1 and F2 are disposed between the first active region A1 and the first source region S1 and between the first active region A1 and the first drain region D1, respectively. The third and fourth LDD regions F3 and F4 are disposed between the third active region A3 and the third source region S3 and between the third active region A3 and the third drain region D3, respectively. The first and second LDE regions L1 and L2 are disposed at both edge portions on the outside periphery of the first source and drain regions S1 and D1, respectively. The third and fourth LDE regions L3 and L4 are disposed at both edge portions on the outside periphery of the third source and drain regions S3 and S4, respectively. The LDD regions F1, F2, F3, and F4 dissipate hot carriers. In other words, since the LDD regions F1, F2, F3, and F4 are lightly-doped regions, they prevent increase of leakage current ($I_{off}$) in the TFT.

Then, a doping process with n− (low concentration n-type) impurity ions is conducted using the gate electrodes 126, 128, and 130 as a doping mask. Accordingly, the source regions S1, S2, and S3, the drain regions D1, D2, and D3, the LDD regions F1, F2, F3. and F4, and the LDE regions L1, L2, L3, and L4 are doped with the n− impurity ions while the active regions A1, A2, and A3 are not doped.

Figure 18A:
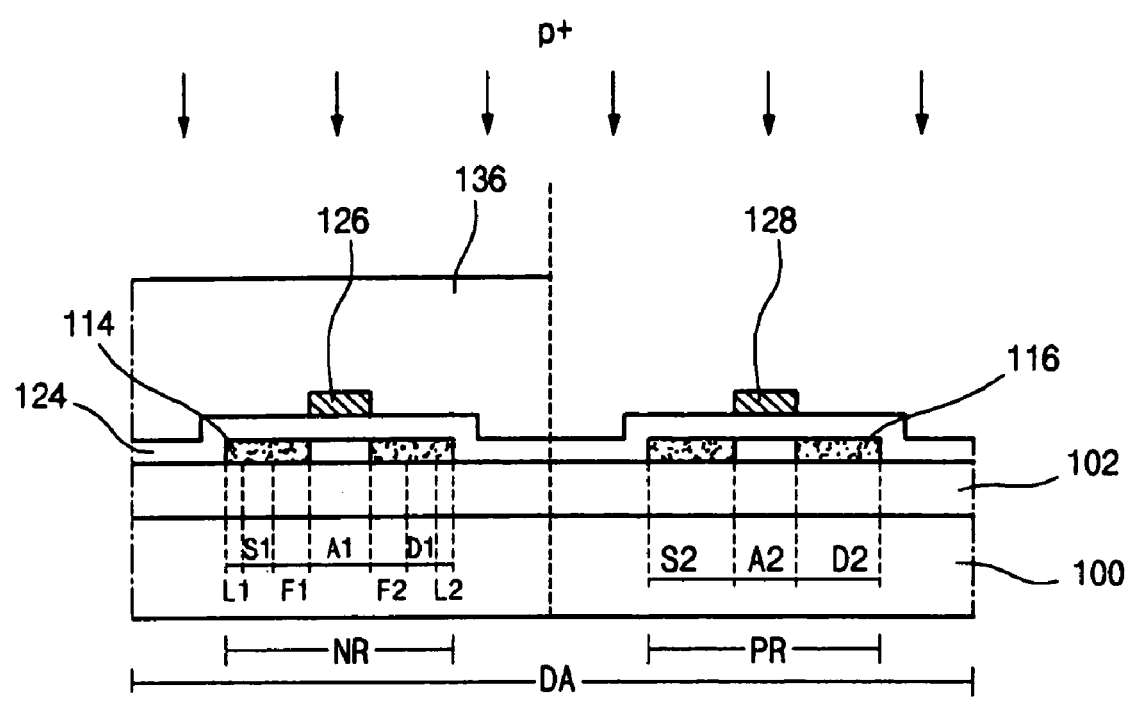
FIGS. 18A and 18B are cross-sectional views illustrating a driving region and a pixel region, respectively, of an array substrate for the LCD device in a third mask process according to an exemplary embodiment of the present invention.
Figure 18B:
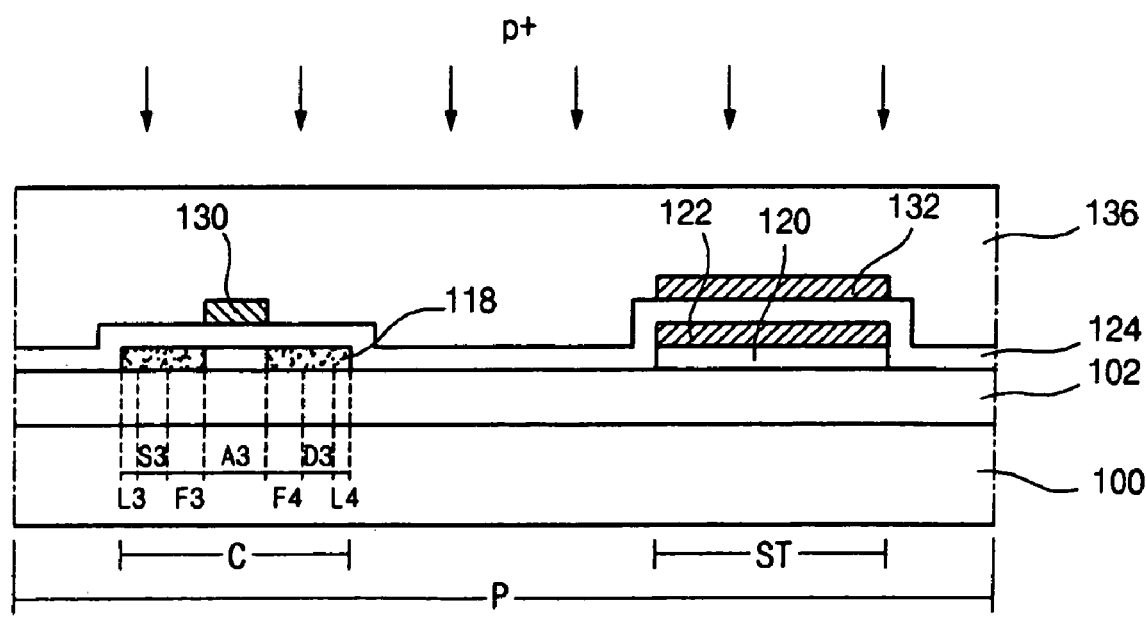

FIGS. 18A and 18B are cross-sectional views illustrating a driving region and a pixel region, respectively, of an array substrate for the LCD device in a third mask process according to an exemplary embodiment of the present invention. A photoresist is deposited on the substrate 100 having the n− doped active patterns 114, 116 and 118. The photoresist layer is patterned with a third mask (not shown) to form a photoresist pattern 136 exposing the p-type driving region PR and covering the n-type driving region NR and the pixel region P as illustrated in FIGS. 18A and 18B. In other words, the second source and drain regions S2 and D2 are not covered by the photoresist patterns 136.

Then, a doping process with p+ (high concentration p-type) impurity ions is conducted using the photoresist pattern 136 as a doping mask. Accordingly, the second source and drain regions S2 and D2 are doped with p+ impurity ions to function as ohmic contact layers. Although the second source and drain regions S2 and D2 were doped previously with n− impurity ions, the p+ doping dominates the second source and drain regions S2 and D2 because p+ impurity ions have a higher concentration than the n− doping. Once the p+ doping process is finished, the photoresist patterns 136 are removed.

Figure 19A:
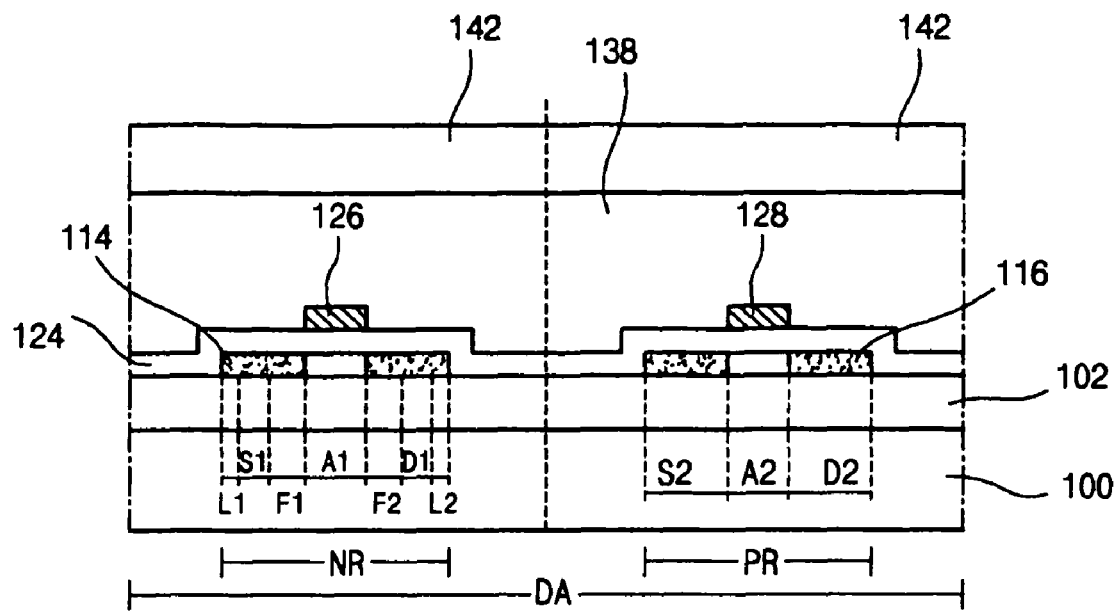
FIGS. 19A and 19B are cross-sectional views illustrating a driving region and a pixel region, respectively, of an array substrate for the LCD device in a process of forming an interlayer insulating film and a photoresist layer according to an exemplary embodiment of the present invention.
Figure 19B:
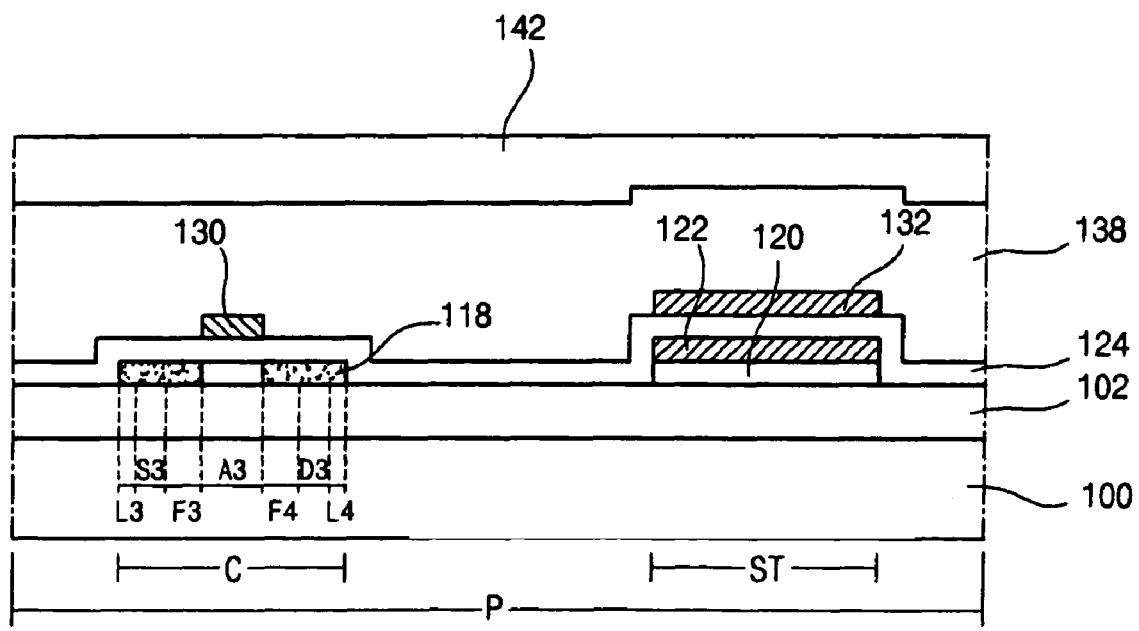

FIGS. 19A and 19B are cross-sectional views illustrating a driving region and a pixel region, respectively, of an array substrate for the LCD device in a process of forming an interlayer insulating film and a photoresist layer according to an exemplary embodiment of the present invention. As illustrated in FIGS. 19A and 19B, an insulating interlayer 138 and a photoresist layer 142 are respectively formed on the substrate 100 having the p+ doped second active pattern 116.

Figure 20A:
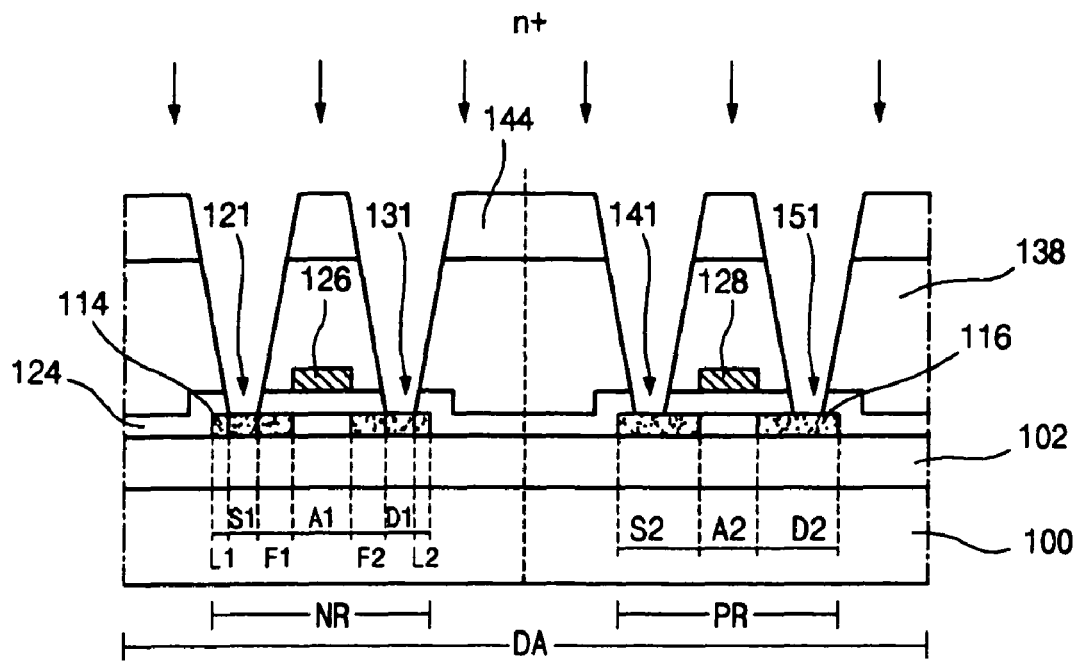
FIGS. 20A and 20B are cross-sectional views illustrating a driving region and a pixel region, respectively, of an array substrate for the LCD device in a fourth mask process according to an exemplary embodiment of the present invention.
Figure 20B:
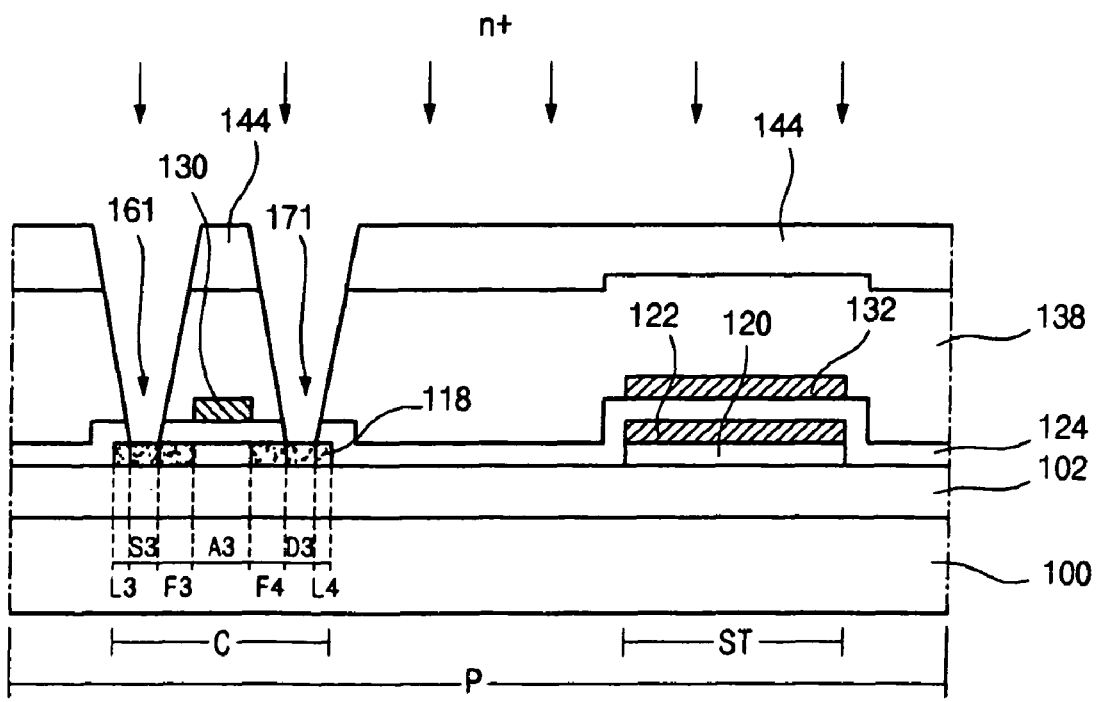

FIGS. 20A and 20B are cross-sectional views illustrating a driving region and a pixel region, respectively, of an array substrate for the LCD device in a fourth mask process according to an exemplary embodiment of the present invention. As illustrated in FIGS. 20A and 20B, the photoresist layer (142 of FIGS. 19A and 19B) is patterned with a fourth mask (not shown) to form a photoresist pattern 144. Thereafter, the interlayer insulating film 138 and the gate insulator 124 are patterned to form first and second contact holes 121 and 131 to expose the first source and drain regions S1 and D1, respectively. Similarly, third and fourth contact holes 141 and 151 and the fifth and sixth contact holes 161 and 171 are also formed exposing the second source and drain regions S2 and D2 and the third source and drain regions S3 and D3, respectively.

Then, while the photoresist pattern 144 remains on the interlayer insulating film 138, doping process with n+ impurity ions is conducted. During the n+ impurity ion doping process, the photoresist pattern 144 and the insulating interlayer 138 function as a doping mask. Accordingly, the exposed first source and drain regions S1 and D1 and the exposed third source and drain regions S3 and D3 are doped with n+ impurity ions to function as ohmic contact layers. The exposed first source and drain regions S1 and D1 and the exposed third source and drain regions S3 and D3 are aligned with the first, second, fifth, and sixth contact holes 121, 131, 161, and 171, respectively. Although the first source and drain regions S1 and D1 and the third source and drain regions S3 and D3 were doped previously with n− impurity ions, the n+ impurity ions dominate the first source and drain regions S1 and D1 and the third source and drain regions S3 and D3 because the n+ doping has a higher concentration than the n− doping. The LDD regions F1, F2, F3, and F4 and the LDE regions L1, L2, L3, and L4 still remain as lightly-doped regions. In addition, because the n+ doping has a lesser concentration than the p+ doping, the second source and drain regions S2 and D2 still remain as p+ doped regions. Once the doping process is finished, the photoresist patterns 144 are removed.

Figure 21A:
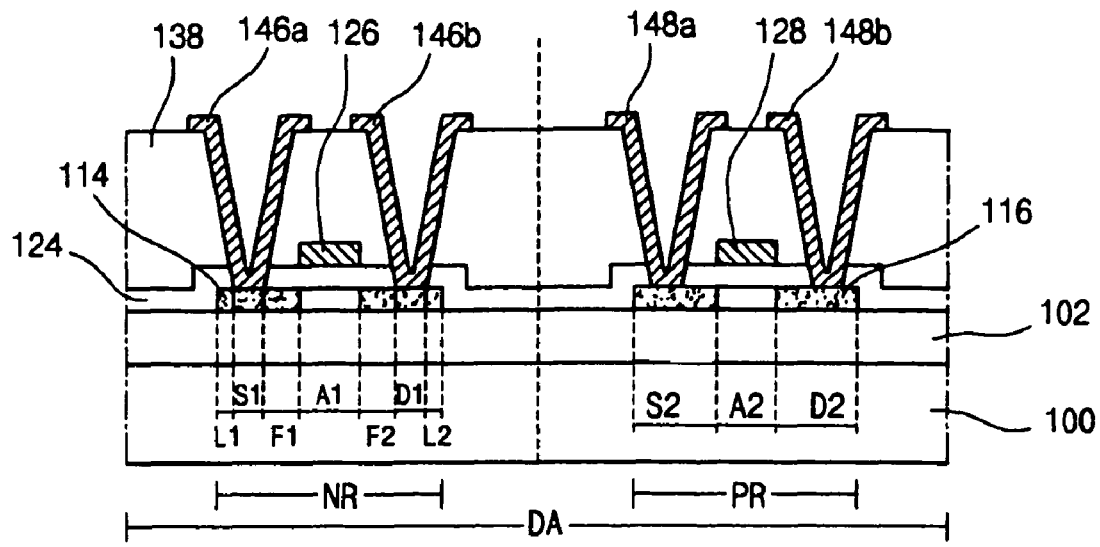
FIGS. 21A and 21B are cross-sectional views illustrating a driving region and a pixel region, respectively, of an array substrate for the LCD device in a fifth mask process according to an exemplary embodiment of the present invention.
Figure 21B:
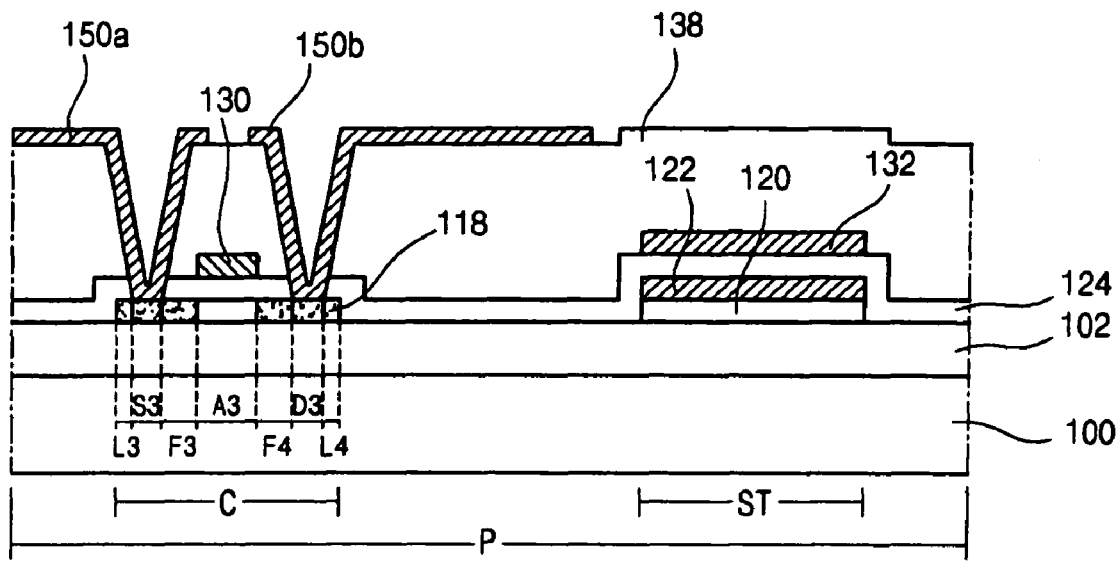

FIGS. 21A and 21B are cross-sectional views illustrating a driving region and a pixel region, respectively, of an array substrate for the LCD device in a fifth mask process according to an exemplary embodiment of the present invention. As illustrated in FIGS. 21A and 21B, a conductive material is deposited on the interlayer insulating film 138 and patterned with a fifth mask (not shown) to form first, second, and third source electrodes 146a, 148a, 150a and first, second, and third drain electrodes 146b, 148b, 150b. The conductive material may include aluminum (Al), aluminum alloy (AlNd), copper (Cu), molybdenum (Mo), tungsten (W), titanium (Ti) and chromium (Cr). However, other conductive materials may be used as appropriate. The first source and drain electrodes 146a and 146b contact the first source and drain regions S1 and D1 through the first and second contact holes (121 and 131 of FIG. 20A). Similarly, the second source and drain electrodes 148a and 148b contact the second source and drain regions S2 and D2 through the third and fourth contact holes (141 and 151 of FIG. 20A), and the third source and drain electrodes 150a and 150b contact the third source and drain regions S3 and D3 through the fifth and sixth contact holes (161 and 171 of FIG. 20B). Using the above-described processes, an n-type TFT, a p-type TFT, and a pixel TFT are formed in the n-type region NR, the p-type region PR, and the pixel region P, respectively.

Figure 22A:
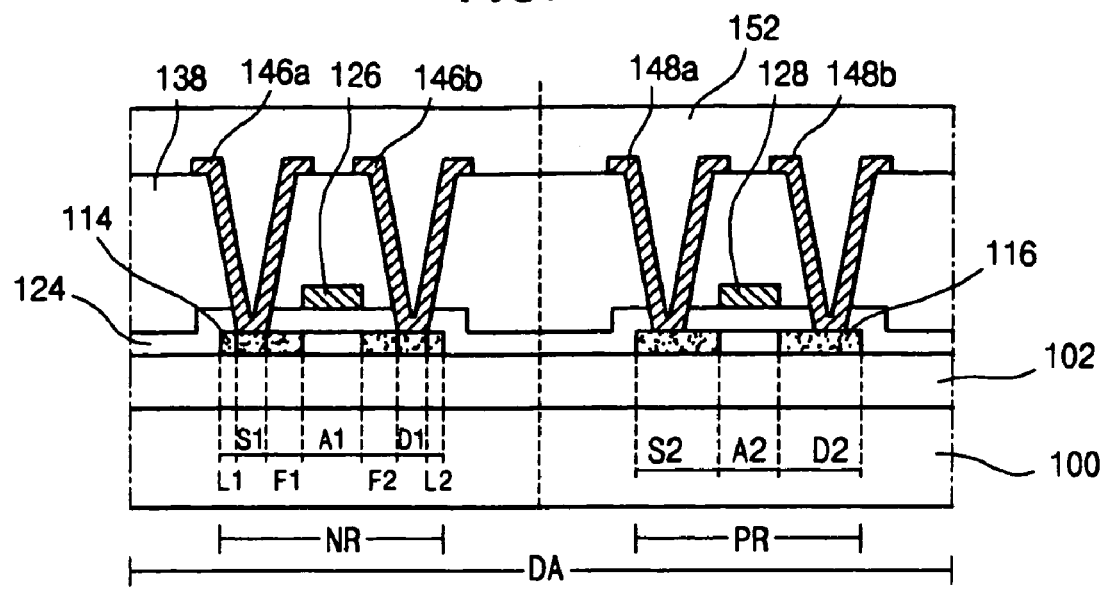
FIGS. 22A and 22B are cross-sectional views illustrating a driving region and a pixel region, respectively, of an array substrate for the LCD device in a sixth mask process according to an exemplary embodiment of the present invention.
Figure 22B:
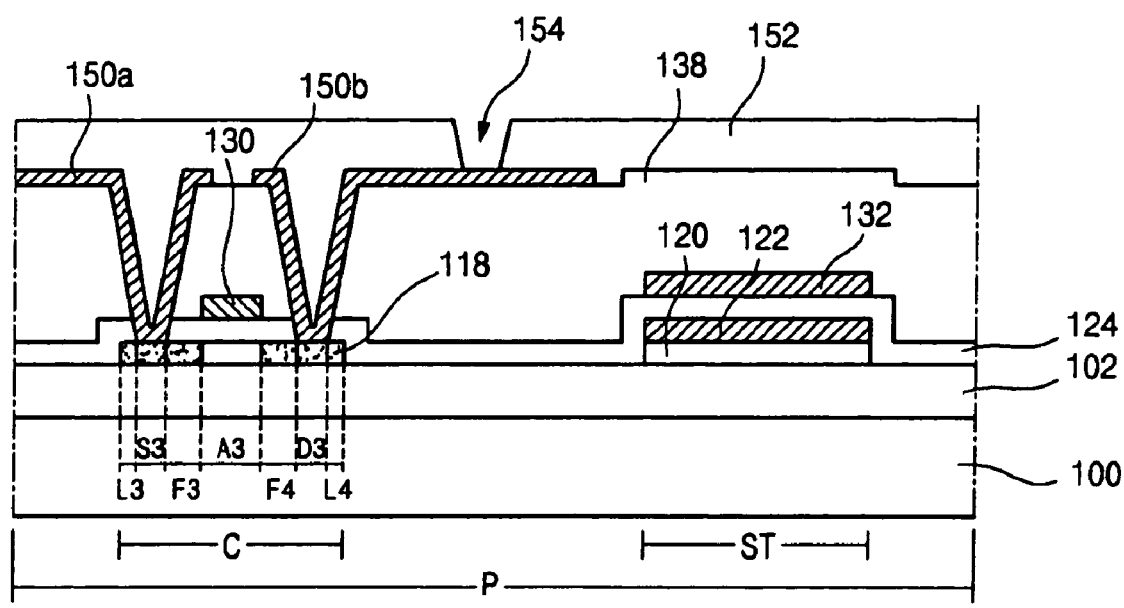

FIGS. 22A and 22B are cross-sectional views illustrating a driving region and a pixel region, respectively, of an array substrate for the LCD device in a sixth mask process according to an exemplary embodiment of the present invention. As illustrated in FIGS. 22A and 22B, a passivation layer 152 is formed on the substrate 100 having the source and drain electrodes 146a, 146b, 148a, 148b, 150a and 150b. Then, the passivation layer 152 is patterned with a sixth mask (not shown) to form a drain contact hole 154 exposing the third drain electrode 150b.

Figure 23A:
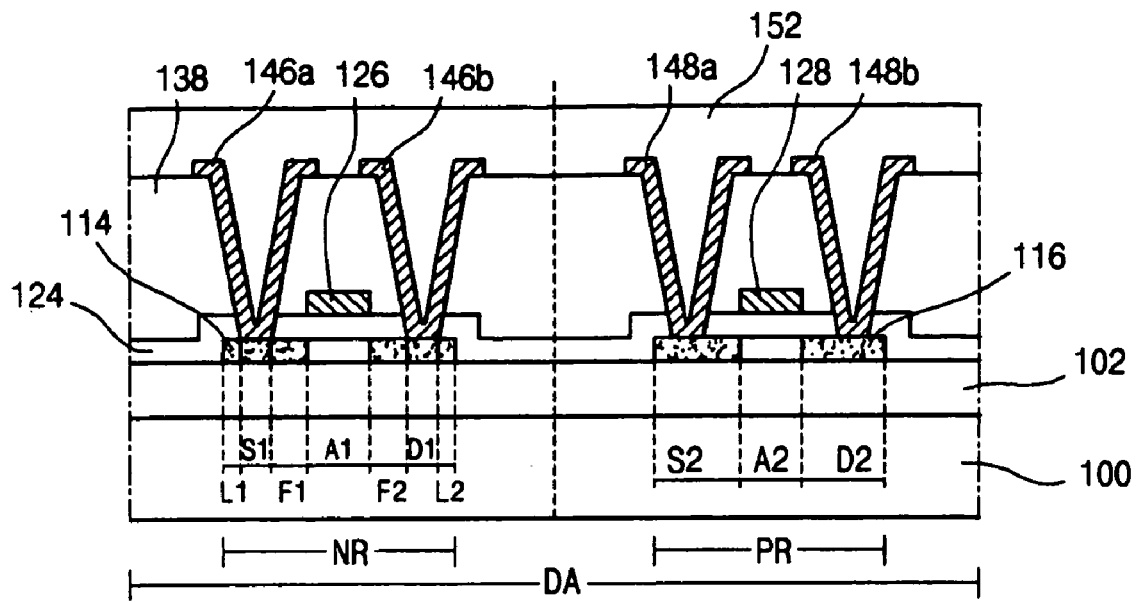
FIGS. 23A and 23B are cross-sectional views illustrating a driving region and a pixel region, respectively, of an array substrate for the LCD device in a seventh mask process according to an exemplary embodiment of the present invention.
Figure 23B:
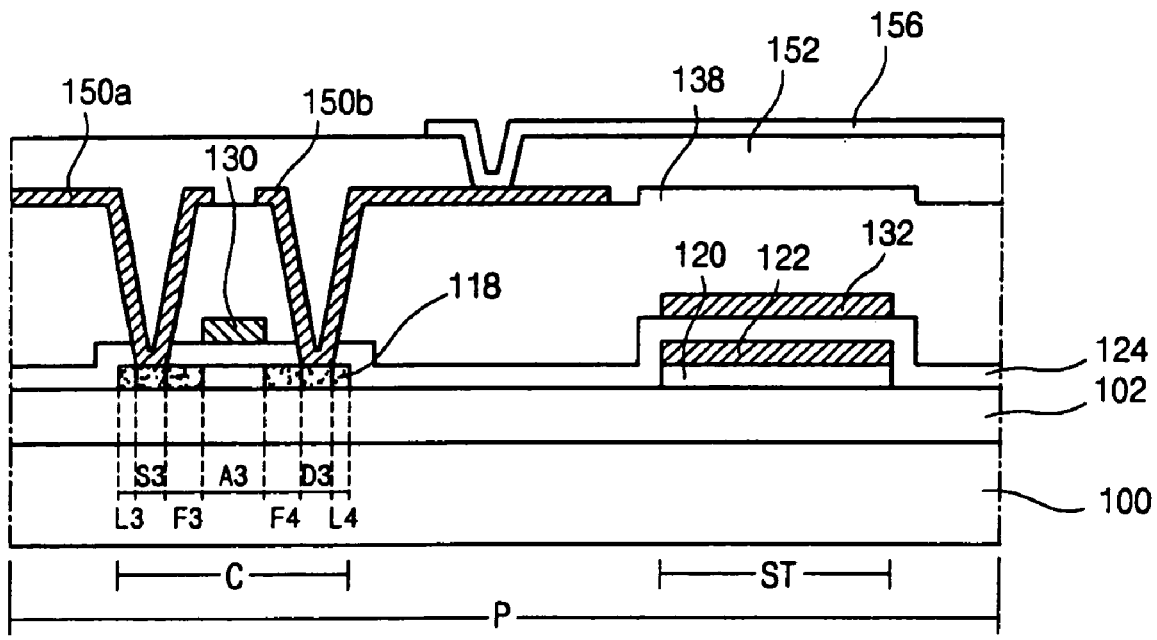

FIGS. 23A and 23B are cross-sectional views illustrating a driving region and a pixel region, respectively, of an array substrate for the LCD device in a seventh mask process according to an exemplary embodiment of the present invention. A transparent conductive material is deposited on the passivation layer 152. Then, the transparent conductive material layer is patterned with a seventh mask (not shown) to form a pixel electrode 156 in the pixel region P as illustrated in FIGS. 23A and 23B. The pixel electrode 156 contacts the third drain electrode 150b through the drain contact hole (154 of FIG. 22B). The transparent conductive material may include indium-tin-oxide (ITO) and indium-zinc-oxide (IZO). However, any other appropriate conductive material may be used.

As explained above, the array substrate of an exemplary embodiment of the present invention may be fabricated through the seven exemplary mask processes according to the present invention, which is at least two mask processes less than the related art. In particular, the mask processes for impurity-doping is reduced. Accordingly, time and cost for fabricating the array substrate is reduced.

It will be apparent to those skilled in the art that various modifications and variations can be made in the LCD device and the method of fabricating the same according the present invention without departing form the spirit or scope of the invention. Thus, it is intended that the present invention cover the modifications and variations of this invention provided they come within the scope of the appended claims and their equivalents.

What is claimed is:

1. A liquid crystal display device, comprising:
a substrate comprising a pixel region and a driving region;
first, second, and third active patterns formed on the substrate, the first and second active patterns being in the driving region, the third active pattern being in the pixel region, the first, second, and third active patterns each comprising an active region, a source region, and a drain region with the source and drain regions on opposing sides of the active region, each of the first and third active patterns further including first and second LDD regions and first and second LDE regions, the first LDD region being between the active region and the source region, the second LDD region being between the active region and drain region, the first LDE region being at the outer periphery of the source region, the second LDE region being at the outer periphery of the drain region, the source region being between the first LDD region and the first LDE region, the drain region bring between the second LDD region and the second LDE region;
a gate insulator on the first, second, and third active patterns;
first, second, and third gate electrodes on the gate insulator, the first, second, and third gate electrodes corresponding to the active regions of the first, second, and third active patterns, respectively;
an interlayer insulating film comprising contact holes exposing each source and drain regions of the first, second, and third active patterns;
first, second, and third source electrodes contacting the source region of the first, second, and third active patterns, respectively, through corresponding contact holes; and
first, second, and third drain electrodes contacting the drain region of the first, second, and third active patterns, respectively, through corresponding contact holes.

2. The device according to claim 1, wherein each of the first and second LDD regions are covered by the interlayer insulating film.

3. The device according to claim 2, wherein the first and second LDE regions are covered by the interlayer insulating film.

4. The device according to claim 1, wherein the source and drain regions of the first, second, and third active patterns, the first and second LDD regions of the first and third active patterns, and the first and second LDE regions of the first and third active patterns are doped with n− ions.

5. The device according to claim 4, wherein the source and drain regions of the second active pattern are doped with p+ ions.

6. The device according to claim 5, wherein the source and drain regions of the first, second, and third active patterns are doped with n+ ions.

7. The device according to claim 6, wherein a concentration of the n+ ions is higher than that of the n− ions and a concentration of the p+ ions is higher than that of the n+ ions.

8. The device according to claim 1, further comprising:
a storage pattern extended from the third active pattern;
a storage electrode on the storage pattern; and
a storage line on the gate insulator overlapping the storage electrode.

9. The device according to claim 8, wherein the storage pattern is aligned with the storage electrode.

* * * * *